US012677420B2

(12) United States Patent
Hu

(10) Patent No.: US 12,677,420 B2
(45) Date of Patent: Jul. 7, 2026

(54) SINGLE CRYSTAL SILICON CORES FOR STACKED MEMORY CELLS

(71) Applicant: Micron Technology, Inc., Boise, ID (US)

(72) Inventor: Yongjun Hu, Boise, ID (US)

(73) Assignee: Micron Technology, Inc., Bosie, ID (US)

( * ) Notice: Subject to any disclaimer, the term of this patent is extended or adjusted under 35 U.S.C. 154(b) by 907 days.

(21) Appl. No.: 18/047,571

(22) Filed: Oct. 18, 2022

(65) Prior Publication Data

US 2024/0130128 A1     Apr. 18, 2024

(51) Int. Cl.
| | |
|---|---|
| *H10B 43/35* | (2023.01) |
| *G11C 5/06* | (2006.01) |
| *H10B 41/35* | (2023.01) |
| *H10B 43/20* | (2023.01) |

(52) U.S. Cl.
CPC ............. *H10B 43/35* (2023.02); *G11C 5/063* (2013.01); *H10B 41/35* (2023.02); *H10B 43/20* (2023.02)

(58) Field of Classification Search
CPC ........ H10B 43/35; H10B 41/35; H10B 43/20; H10B 43/27; G11C 5/063
See application file for complete search history.

(56) References Cited

U.S. PATENT DOCUMENTS

| | | | | |
|---|---|---|---|---|
| 10,535,659 B2 * | 1/2020 | Kim | ...................... | H10B 12/30 |
| 2010/0128509 A1 * | 5/2010 | Kim | ................... | G11C 16/0416 |
| | | | | 365/189.011 |
| 2018/0151588 A1 * | 5/2018 | Tsutsumi | ............... | H10B 43/27 |
| 2018/0366486 A1 * | 12/2018 | Hada | ..................... | H10B 41/27 |
| 2020/0119046 A1 * | 4/2020 | Tang | ..................... | H10B 43/27 |

* cited by examiner

*Primary Examiner* — Steven B Gauthier
*Assistant Examiner* — Khatib A Rahman
(74) *Attorney, Agent, or Firm* — Holland & Hart LLP

(57) ABSTRACT

Methods, systems, and devices for single crystal silicon cores for stacked memory cells are described. A memory device may be formed using silicon cores that are each associated with a set of multiple memory cells. Multiple silicon cores may extend along a first direction, and multiple sleeves of memory materials and conductive materials may be formed around each silicon core. Each sleeve of memory materials may be associated with a respective memory cell and each conductive material may be associated with a word line, such that each silicon core may be associated with multiple memory cells. The respective sleeves of memory materials and conductive materials may be formed from larger sleeves of material that may be etched into sections of the memory materials and the conductive materials along the silicon cores.

8 Claims, 27 Drawing Sheets

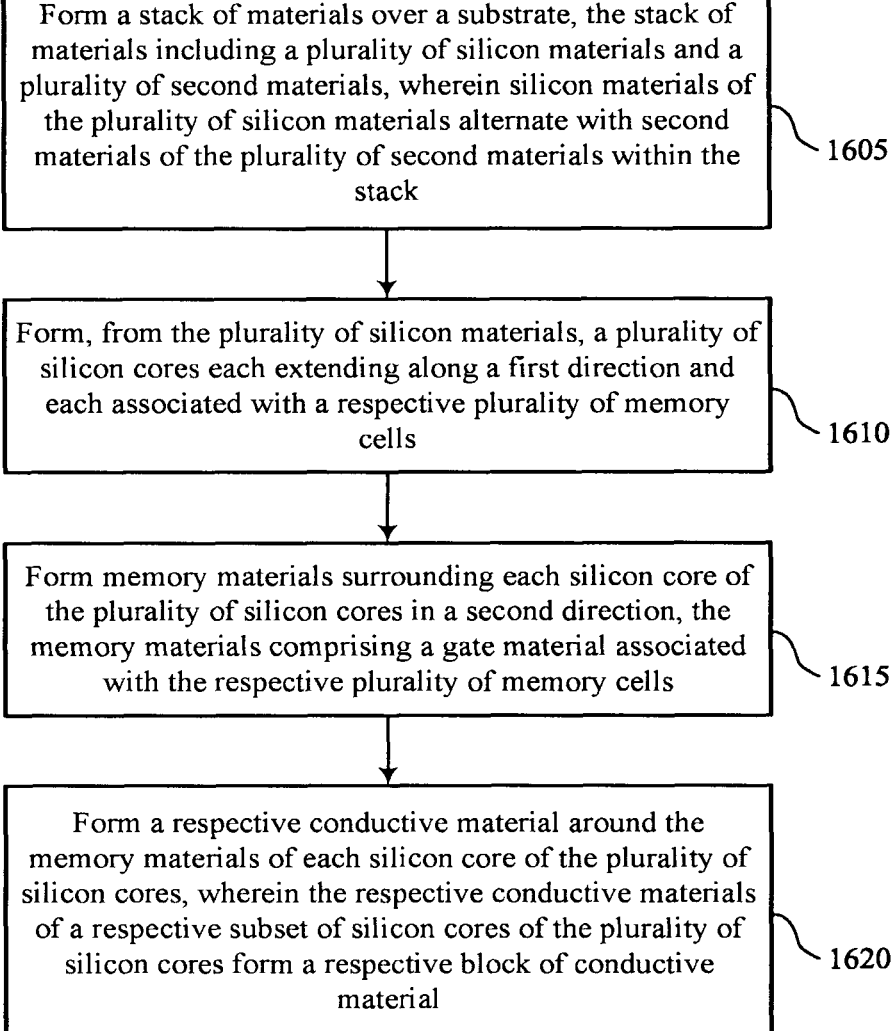

Form a stack of materials over a substrate, the stack of materials including a plurality of silicon materials and a plurality of second materials, wherein silicon materials of the plurality of silicon materials alternate with second materials of the plurality of second materials within the stack

1605

Form, from the plurality of silicon materials, a plurality of silicon cores each extending along a first direction and each associated with a respective plurality of memory cells

1610

Form memory materials surrounding each silicon core of the plurality of silicon cores in a second direction, the memory materials comprising a gate material associated with the respective plurality of memory cells

1615

Form a respective conductive material around the memory materials of each silicon core of the plurality of silicon cores, wherein the respective conductive materials of a respective subset of silicon cores of the plurality of silicon cores form a respective block of conductive material

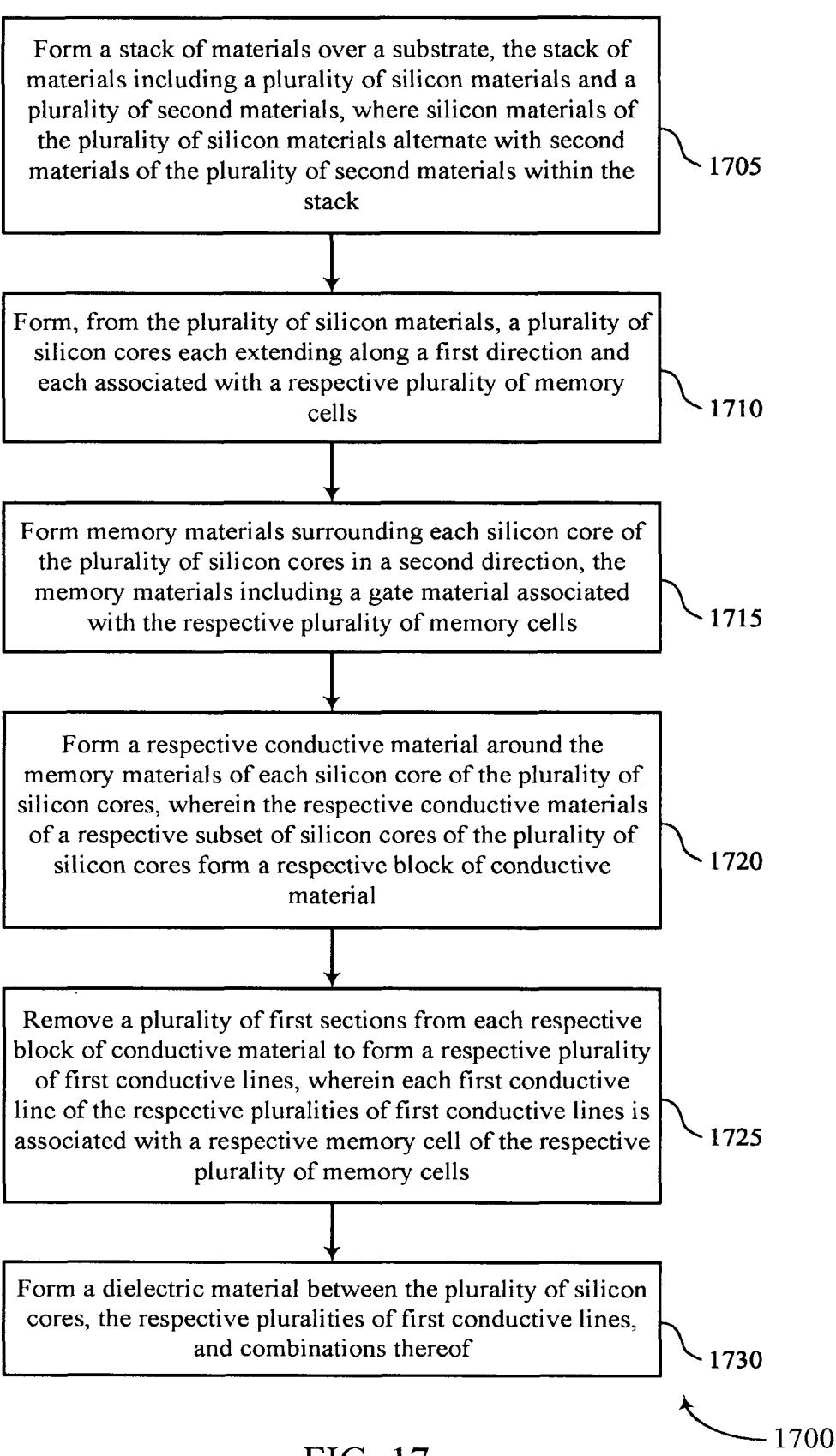

Form a stack of materials over a substrate, the stack of materials including a plurality of silicon materials and a plurality of second materials, where silicon materials of the plurality of silicon materials alternate with second materials of the plurality of second materials within the stack                                1705

Form, from the plurality of silicon materials, a plurality of silicon cores each extending along a first direction and each associated with a respective plurality of memory cells                                1710

Form memory materials surrounding each silicon core of the plurality of silicon cores in a second direction, the memory materials including a gate material associated with the respective plurality of memory cells                                1715

Form a respective conductive material around the memory materials of each silicon core of the plurality of silicon cores, wherein the respective conductive materials of a respective subset of silicon cores of the plurality of silicon cores form a respective block of conductive material                                1720

Remove a plurality of first sections from each respective block of conductive material to form a respective plurality of first conductive lines, wherein each first conductive line of the respective pluralities of first conductive lines is associated with a respective memory cell of the respective plurality of memory cells                                1725

Form a dielectric material between the plurality of silicon cores, the respective pluralities of first conductive lines, and combinations thereof                                1730

SINGLE CRYSTAL SILICON CORES FOR STACKED MEMORY CELLS

FIELD OF TECHNOLOGY

The following relates to one or more systems for memory, including single crystal silicon cores for stacked memory cells.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

BRIEF DESCRIPTION OF THE DRAWINGS

FIGS. 3, 4A, 4B, 5A, 5B, 6A, 6B, 7A, 7B, 8A, 8B, 8C, 9A, 9B, 9C, 10, 11A, 11B, 11C, 12A, 12B, 12C, 12D, 12E, 12F, 13A, 13B, 14, and 15 each illustrate a memory device configuration that supports the formation of single crystal silicon cores for stacked memory cells in accordance with examples as disclosed herein.

FIGS. 16 and 17 show flowcharts illustrating a method or methods that support single crystal silicon cores for stacked memory cells in accordance with examples as disclosed herein.

DETAILED DESCRIPTION

Some memory devices may be formed using multi-crystal silicon materials. Specifically, three-dimensional (3D) not-and (NAND) memory structures may be formed using multi-crystal silicon materials, which may affect device performance due to the multi-crystal silicon materials experiencing lower performance, lower conductivity, and the like. Due to the relatively complex structure of 3D NAND, alternative materials, such as single crystal silicon materials, may be difficult to form in place of the multi-crystal silicon materials. In some cases, 3D NAND structures may also extend in a vertical direction (e.g., relative to a substrate), which may result in deformation of one or more associated structures (e.g., wafer bow).

The present disclosure provides techniques for forming single crystal silicon cores that are each associated with a plurality of memory cells. Instead of being oriented (stacked) to extend along a vertical direction, these silicon cores may be oriented in a horizontal direction (e.g., may run along a same direction as a substrate), which may support formation of a single crystal structure. For example, multiple silicon cores each associated with multiple memory cells may extend along a first direction, and multiple sleeves of memory materials (e.g., gate materials) and conductive materials may be formed around each silicon core. The sleeves may be formed from a larger sleeve of materials which may be etched into sections of the memory materials and the conductive materials along the silicon cores, creating vertical conductive lines for gate access across the horizontal silicon cores. In addition to the higher performance and higher conductivity of the single crystal silicon cores, this structure may also decrease a wafer bow that is a result of traditional 3D NAND structures extending in the vertical direction. Although these techniques are described with reference to NAND devices, the techniques may also be applied to any 3D logic or 3D memory devices (e.g., the formation of polysilicon channels in complementary metal-oxide-semiconductor (CMOS) devices).

Figure 1:
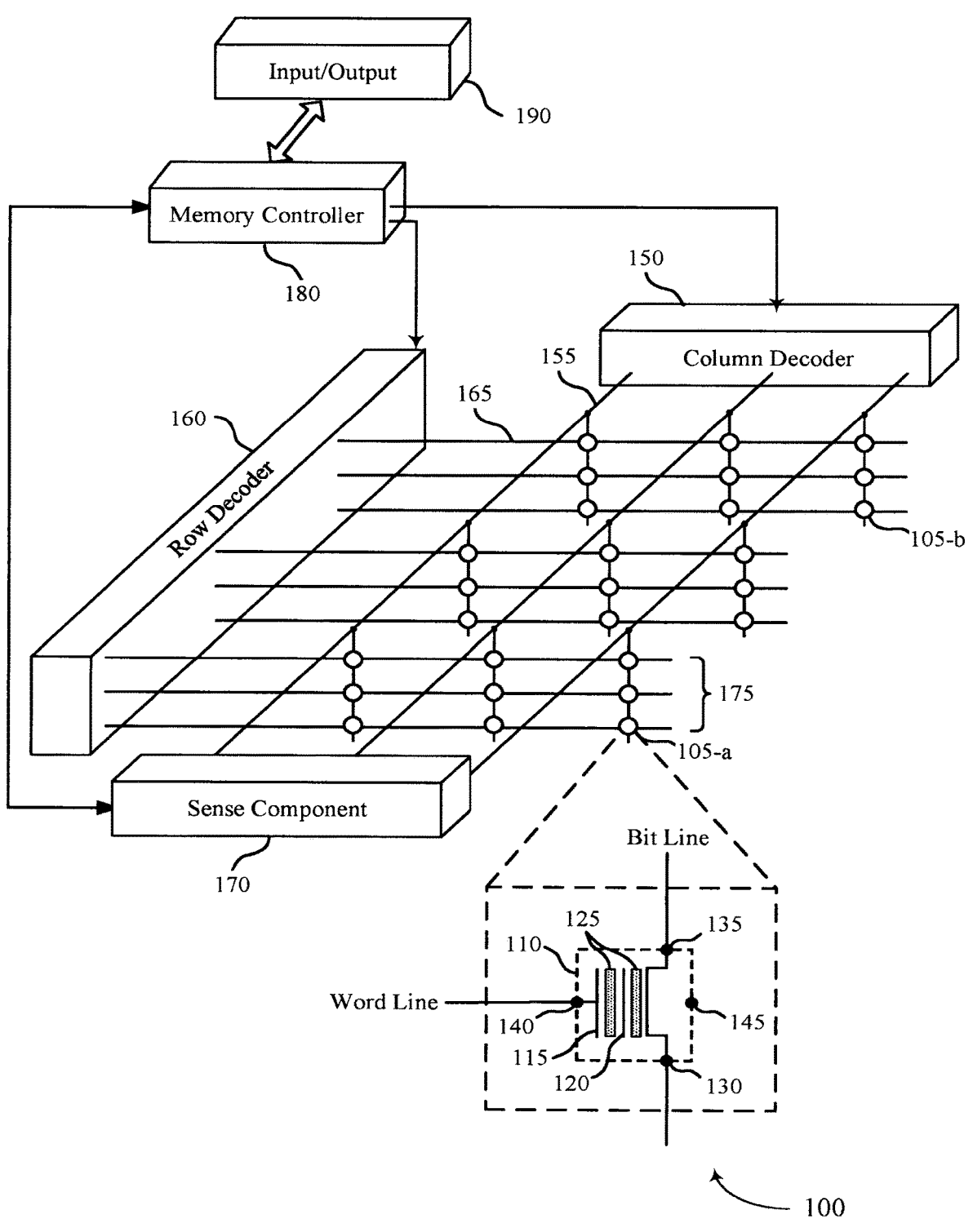
FIG. 1 illustrates an example of a system that supports single crystal silicon cores for stacked memory cells in accordance with examples as disclosed herein.
Figure 2:
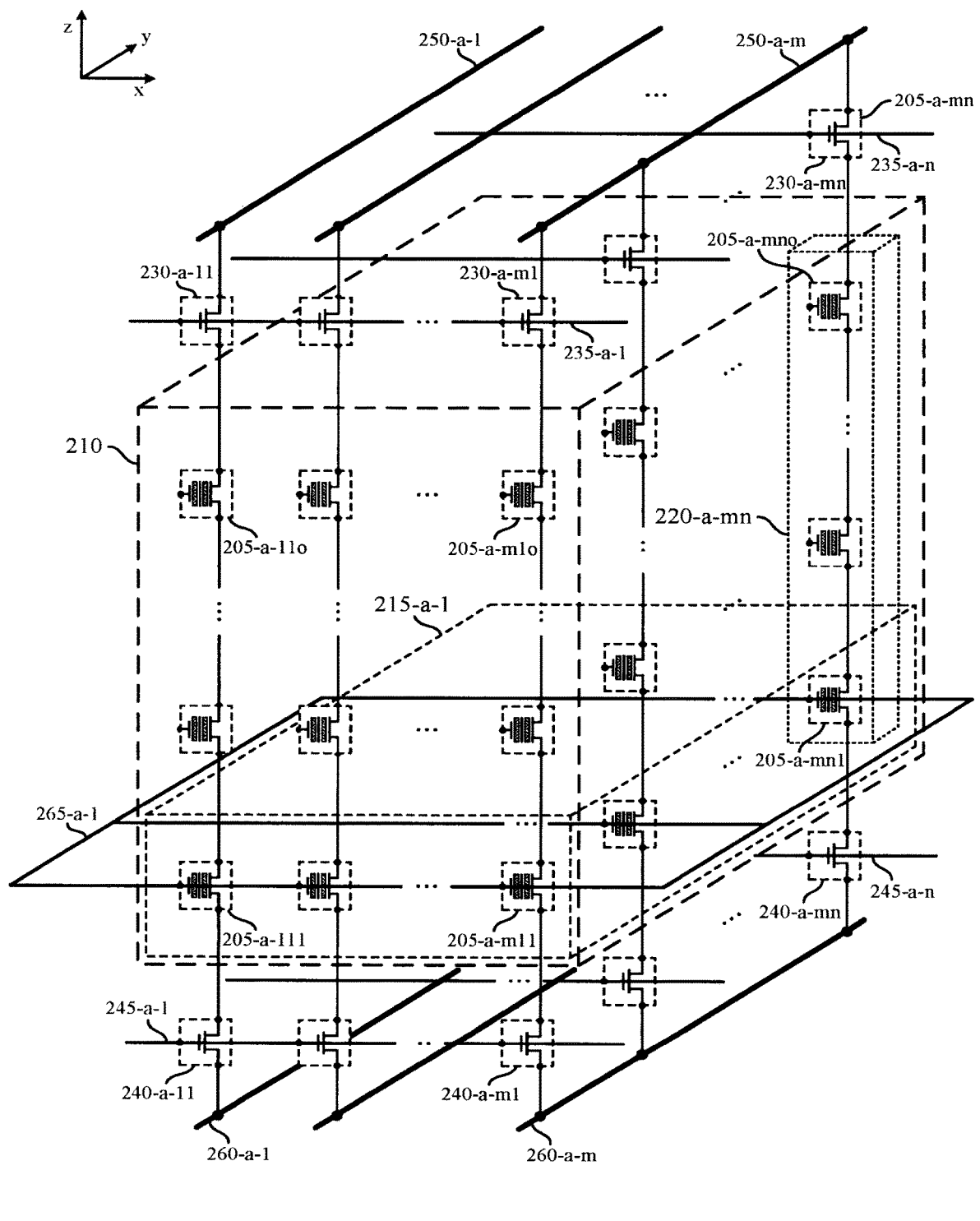
FIG. 2 illustrates an example of a memory architecture that supports single crystal silicon cores for stacked memory cells in accordance with examples as disclosed herein.

Features of the disclosure are initially described in the context of systems, devices, and circuits with reference to FIGS. 1 and 2. Features of the disclosure are described in the context of forming a memory device configuration that supports single crystal silicon cores for stacked memory cells with reference to FIGS. 3 through 15. These and other features of the disclosure are further illustrated by and described in the context of an apparatus diagram and flowchart that relate to single crystal silicon cores for stacked memory cells with reference to FIGS. 16 and 17.

FIG. 1 illustrates an example of a memory device 100 that supports single crystal silicon cores for stacked memory cells in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one state of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., bit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. As part of such accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

Although the memory device 100 is illustrated with respect to an orientation, the memory device 100 may be oriented in any direction. Likewise, the one or more portions or components of the memory device 100 may be located at different locations within the memory device 100 than shown, based in part on the orientation. For example, portions of the memory device 100 shown as extending along a vertical direction may instead extend along a horizontal direction, or vice versa. Illustrated components of the memory device may also have different orientations or locations, based on the structure of the memory device described herein.

FIG. 2 illustrates an example of a memory architecture 200 that supports single crystal silicon cores for stacked memory cells in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-a-ijk). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-a-1 associated with memory cells 205-a-111 through 205-a-mn1. In some examples, each reference to FIG. 1), which may be coupled with a control gate 115 of each of the memory cells 205 of the page 215. For example, page 215-a-1 may be associated with a word line 265-a-1, and other pages 215-a-i may be associated with a different respective word line 265-a-i (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-a-mn associated with memory cells 205-a-mn1 through 205-a-mno. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from in accordance with a granularity, such as at the granularity of the page 215, but may not be erasable (e.g., reset to a logic 1 value) in accordance with the granularity, such as the granularity of the page 215. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-*a* of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-*a* of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

Although the memory architecture 200 is illustrated with respect to an orientation, the memory architecture 200 may be oriented in any direction. Likewise, the one or more portions or components of the memory architecture 200 may be located at different locations within the memory architecture 200 than shown, based in part on the orientation. For example, portions of the memory architecture 200 shown as extending along a vertical direction may instead extend along a horizontal direction, or vice versa. Illustrated components of the memory device may also have different orientations or locations, based on the structure of the memory device described herein.

Figure 3:
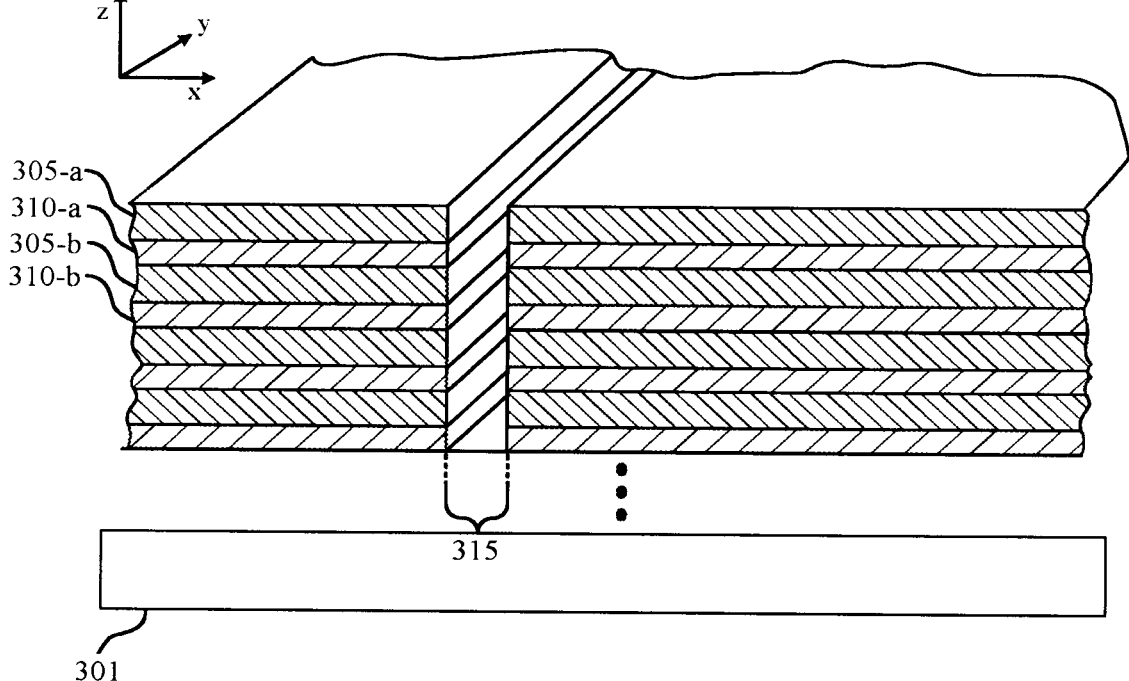

FIG. 3 illustrates an example of a memory device configuration 300 that supports single crystal silicon cores for stacked memory cells in accordance with examples as disclosed herein. The memory device configuration 300 may be an example of or implement aspects of the memory device 100 or memory architecture 200 as described with reference to FIGS. 1 and 2, respectively.

A manufacturing system, such as a semiconductor fabrication system, may form the memory device configuration 300. For example, the manufacturing system may form a substrate 301, and form a stack of layered materials over the substrate 301 (e.g., with one or more other materials between the substrate and the stack, with no additional materials between the substrate 301 and the stack). In some cases, the stack of layered materials may include a plurality of silicon materials 305 (e.g., silicon materials 305-*a* and 305-*b*) as well as a plurality of a second materials 310 (e.g., second materials 310-*a* and 310-*b*) stacked along the z-direction. In some examples, each layer of the silicon material 305 may alternate with a respective layer of the second material 310 in the stack.

In some cases, the silicon materials 305 and the materials 310 may be formed (e.g., deposited) using an epitaxial (EPI) growth technique (e.g., homoepitaxy). For example, the manufacturing system may be configured to grow a single crystal film (e.g., a wafer) of the second material 310 over the substrate 301 (e.g., onto the substrate) using chemical vapor deposition (CVD).

Additionally, the manufacturing system may grow a single crystal film or a multiple crystal film of the silicon material 305 (e.g., slightly in-situ doped silicon material) onto the second material 310, and so on to form the stack. In some examples, each wafer of the silicon material 305 and the second material 310 may be approximately 0.005 to 0.2 microns. In some cases, the EPI silicon of the materials 305 may be a single crystal structure because of the EPI growth technique. In some cases, the silicon of the materials 305 may be a polycrystalline structure. In some examples, the second material 310 may be a silicon germanium alloy with a constant atomic ratio of silicon germanium or a variable atomic ratio of silicon germanium. For example, the atomic ratio of the silicon germanium may increase or decrease as one or more additional layers of the silicon materials 305, one or more additional layers of the second materials 310, or both are formed in the stack. Additionally, the thickness of the silicon germanium may increase as the one or more additional layers of the second materials 310 in the stack. In some examples, forming the one or more additional layers of the silicon materials 305, the one or more additional layers of the second materials 310, or both may reduce stress on the stack and reduce dislocation defects.

The manufacturing system may form (e.g., etch) a trench 315 through the stack of layered materials, extending along the y-direction. For example, a respective trench 315 may separate the stack of layered materials into at least two portions over the substrate 301, and in some examples, the trench 315 may be perpendicular to each layer of the stacked materials. Multiple trenches 315 may be formed across the stack of layered materials along the y-direction, as well as the x-direction, for the eventual formation of bit lines and drain contacts for associated memory cells. In some cases, the manufacturing system may use a dry etching process to form the trench 315.

Figure 4A:
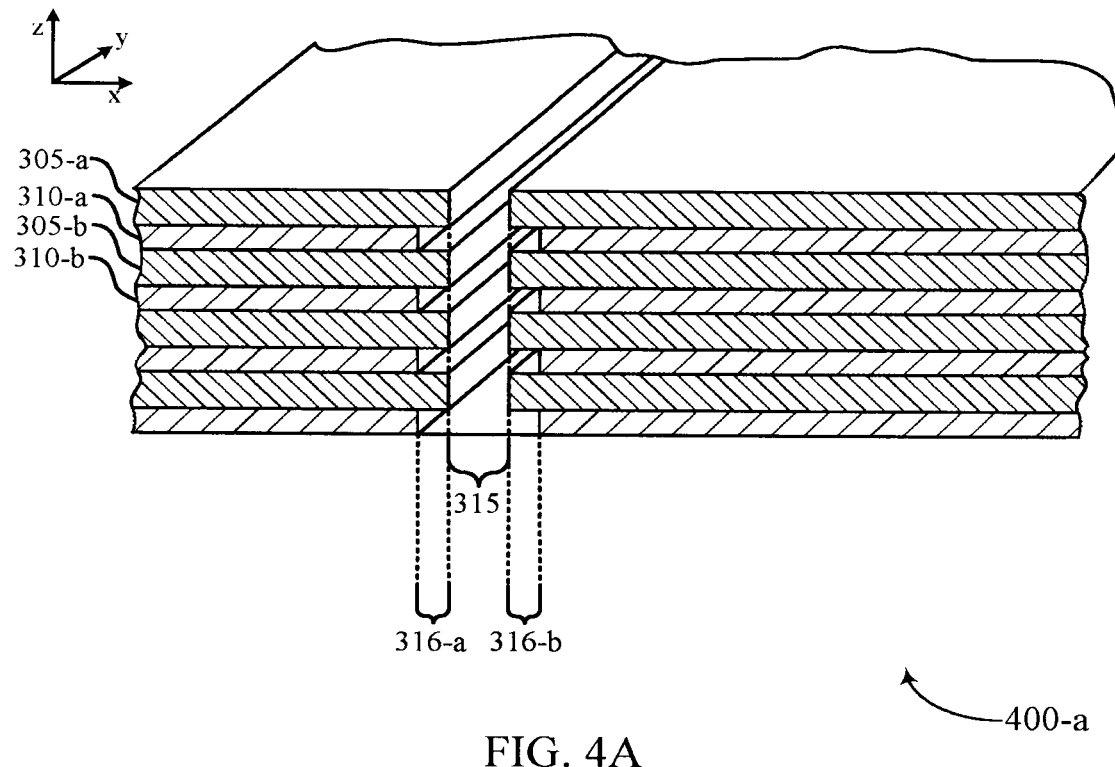

FIG. 4A illustrates an example of a memory device configuration 400-a that supports single crystal silicon cores for stacked memory cells in accordance with examples as disclosed herein. The memory device configuration 400-a may be an example of or implement aspects of the memory device 100 or memory architecture 200 as described with reference to FIGS. 1 and 2, respectively. Additionally, the memory device configuration 400-a may be a continuation of the memory device configuration 300, as described with reference to FIG. 3.

The manufacturing system may form, along the length of the trench 315, a plurality of recesses 316 into a first side of each layer of the second material 310. For example, each recess 316 may be formed into the second material 310 along the x-direction and may extend along the trench 315 along the y-direction. Each recess 316 may be adjacent to (e.g., connected with) the remaining second material 310, an upper layer of the silicon material 305, a lower layer of the silicon material 305, and the trench 315. For example, a plurality of recesses 316-a and 316-b may each interface with a respective layer of the second material 310 and the trench 315. As a result of the recesses 316, each layer of the silicon material 305 may be wider than the layers of second material 310 along the x-direction. For example, each silicon material 305, relative to the neighboring layers of second material 310, may form a lateral plateau along the x-direction. In some cases, each of the recesses 316 may be formed through a selective etch method or a wet etch method (e.g., applied via the trench 315).

Figure 4B:
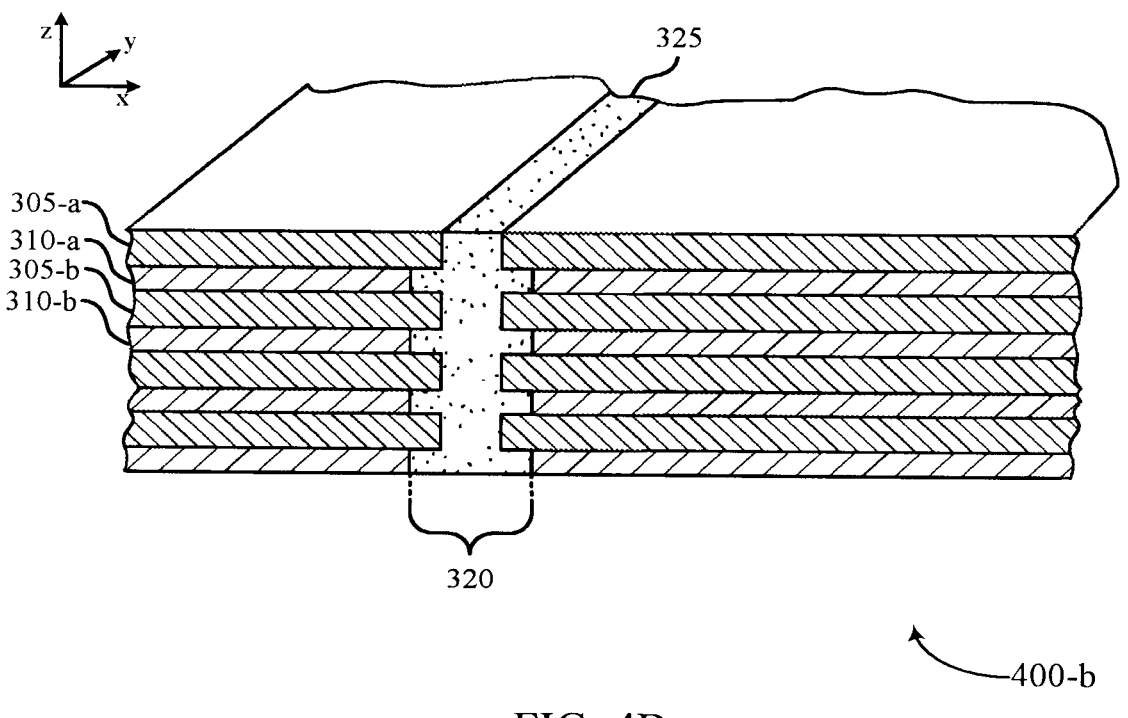

FIG. 4B illustrates an example of a memory device configuration 400-b that supports single crystal silicon cores for stacked memory cells in accordance with examples as disclosed herein. The memory device configuration 400-b may be an example of or implement aspects of the memory device 100 or memory architecture 200 as described with reference to FIGS. 1 and 2, respectively. Additionally, the memory device configuration 400-b may be a continuation of the memory device configuration 400-a, as described with reference to FIG. 4A.

The manufacturing system may deposit a dielectric material 325 (e.g., oxide) in the trench 320 (e.g., the trench 315 and the recesses 316, as described with reference to FIG. 4A). In some cases, the deposited dielectric material 325 may be a temporary (e.g., sacrificial, placeholder) material to stabilize the structure of the memory device configuration 400-b during manufacturing (e.g., while other materials are removed).

The manufacturing system may apply a chemical mechanical planarization (CMP) process to the deposited dielectric material 325. For example, after forming the dielectric material 325, the CMP process may apply chemical oxidation to the dielectric material 325, and apply mechanical abrasion across the surface of the dielectric material 325. The CMP process may result in a high level of planarity between the deposited dielectric material 325 and the silicon materials 305, the materials 310, and the substrate 301 to create a flush (e.g., nearly flush) surface along the z-direction and along the y-direction (e.g., in an xy-plane, an xz-plane, or both).

Figure 5A:
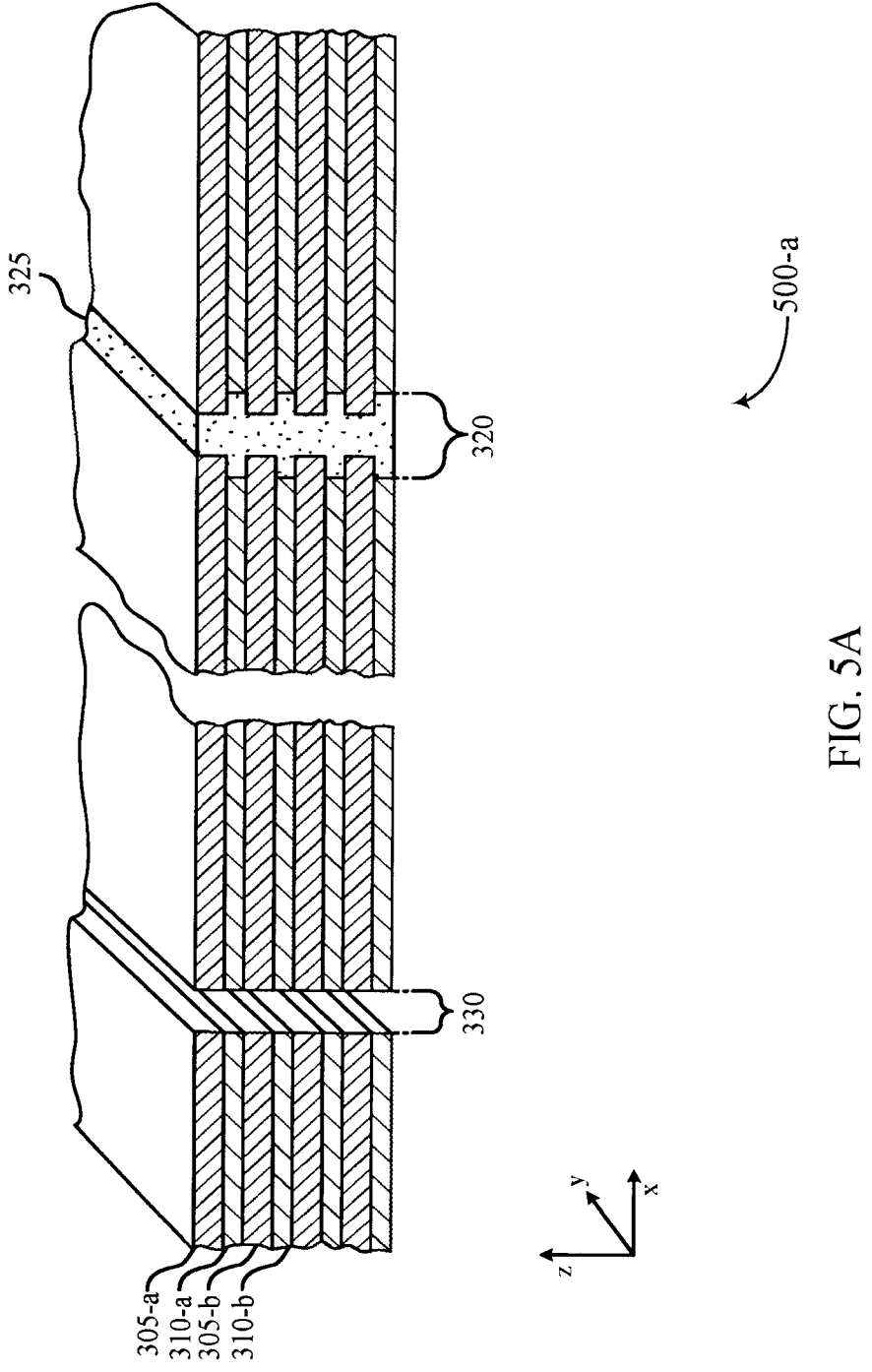

FIG. 5A illustrates an example of a memory device configuration 500-a that supports single crystal silicon cores for stacked memory cells in accordance with examples as disclosed herein. The memory device configuration 500-a may be an example of or implement aspects of the memory device 100 or memory architecture 200 as described with reference to FIGS. 1 and 2, respectively. Additionally, the memory device configuration 500-a may be a continuation of the memory device configuration 400-b, as described with reference to FIG. 4B.

The manufacturing system may form (e.g., etch) a second trench 330 through the stack of layered materials, extending along the y-direction. For example, the trench 330 may separate each layer of the stack of layered materials into respective portions over the substrate 301, and in some examples, the trench 330 may be perpendicular to each layer of the stacked materials. Multiple trenches 330 may be formed across the stack of layered materials along the y-direction, as well as the x-direction, for the eventual formation of source contacts for associated memory cells. For example, a respective trench 330 may be formed on either side of each trench 320, forming an alternating pattern of source contact trenches 330 and drain contact trenches 320. In some cases, the source contacts and the drain contacts may be interchanged in location (e.g., the location of trenches 330 and trenches 320 may be switched), or the source contacts and the drain contacts may be interchangeable (e.g., trenches 330 may be drain contact trenches and trenches 320 may be source contact trenches).

The trenches 330 and the trenches 320 (e.g., and associated trenches 315) may be formed to be relatively straight (e.g., as straight as possible), such that the length may be relatively uniform (e.g., as uniform as possible) for the channels of the drain and source contact transistors. In one example, the trenches 330 and 315 may be formed using low temperature substrate etches (e.g., nebula etches) to achieve a relatively straight configuration.

Figure 5B:
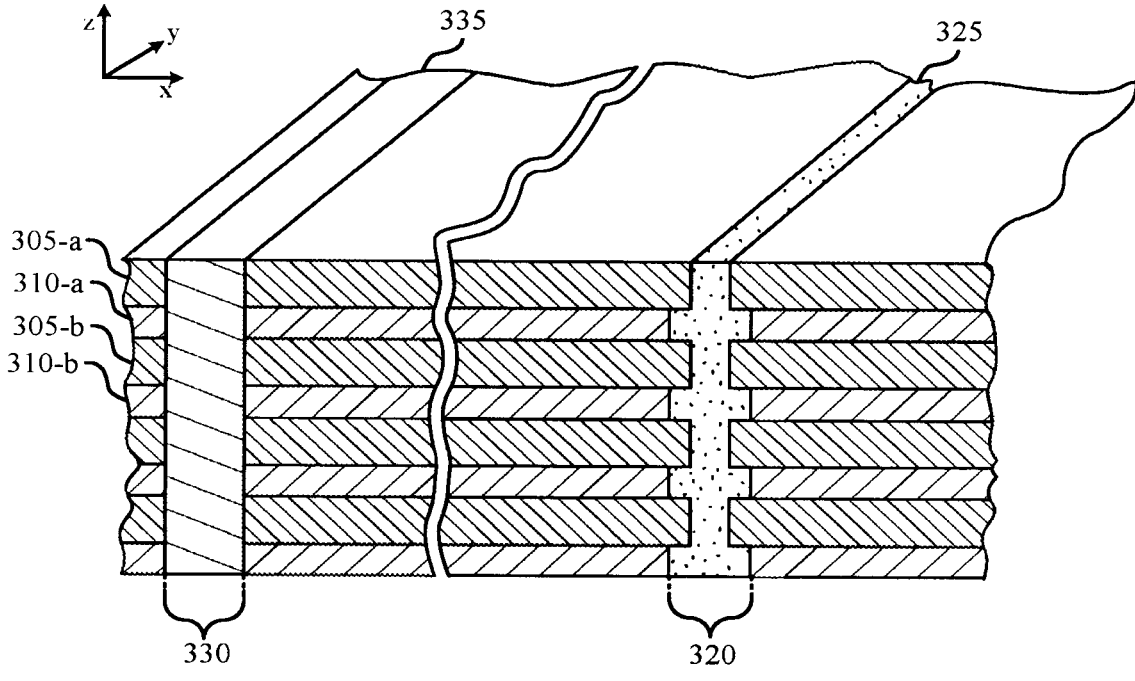

FIG. 5B illustrates an example of a memory device configuration 500-b that supports single crystal silicon cores for stacked memory cells in accordance with examples as disclosed herein. The memory device configuration 500-b may be an example of or implement aspects of the memory device 100 or memory architecture 200 as described with reference to FIGS. 1 and 2, respectively. Additionally, the memory device configuration 500-b may be a continuation of the memory device configuration 500-a as described with reference to FIG. 5A.

The manufacturing system may fill the trench 330 with a material 335. In some cases, the deposited material 335 may be a temporary (e.g., sacrificial, placeholder, etc.) material to stabilize the structure of the memory device configuration 500-b. For example, the deposited material 335 may be an oxide that may be removed and replaced during the manufacturing process. For example, the material 335 may be a heavily doped n-type polysilicon. Alternatively, the deposited material 335 may be a polysilicon material that may be partially removed, but may also be used in the manufactured memory device. For example, the material 335 may be a heavily doped n-type polysilicon, doped using a gas phase doping process. In this case, portions of the deposited material 335 may remain throughout the manufacturing process to form source contacts within the trench 330.

The manufacturing system may apply the CMP process to the deposited material 335. For example, after filling the trench 330 with the material 335, the CMP process may apply chemical oxidation to the material 335, and apply mechanical abrasion across the surface of the material 335. The CMP process may result in a high level of planarity between the deposited material 335 and the silicon materials 305, the materials 310, and the substrate 301 to create a flush (e.g., relatively flush) surface along the z-direction and along the y-direction (e.g., in an xy-plane, an xz-plane, or both).

Figure 6A:
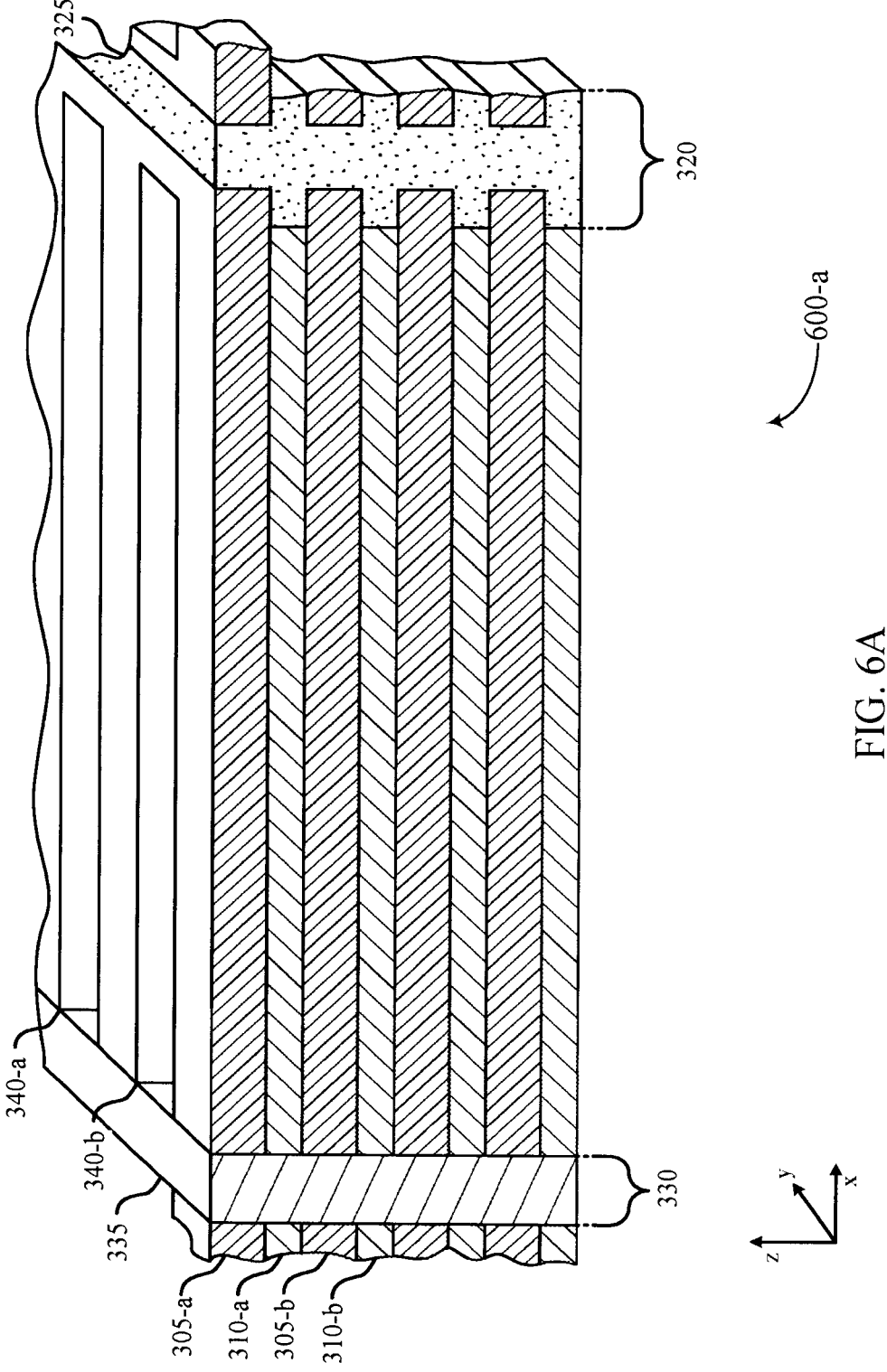

FIG. 6A illustrates an example of a memory device configuration 600-*a* that supports single crystal silicon cores for stacked memory cells in accordance with examples as disclosed herein. The memory device configuration 600-*a* may be an example of or implement aspects of the memory device 100 or memory architecture 200 as described with reference to FIGS. 1 and 2, respectively. Additionally, the memory device configuration 600-*a* may be a continuation of the memory device configuration 500-*b* as described with reference to FIG. 5B.

The manufacturing system may form a plurality of trenches 340 (e.g., 340-*a* and 340-*b*) through the stack of layered materials, each trench 340 extending along the x-direction (e.g., through each layer of the silicon material 305 and the second material 310, along the x-direction). In some cases, the trenches 340-*a* and 340-*b* may extend between the trench 330 and the trench 320 (e.g., between dielectric material 325 and material 335). Additionally, the trenches 340-*a* and 340-*b* may connect with the trench 330 (e.g., with the deposited material 335), and portions of the material 335 may be exposed to the trenches 340-*a* and 340-*b*. Portions of the silicon material 305 may remain at one end of the trenches 340. For example, the remaining portion of the silicon material 305 at each layer of the silicon material 305 may extend alongside the trench 320 along the y-direction to support drain contacts and bit line routings. In some examples, the trenches 340-*a* and 340-*b* may be perpendicular to the trench 330 and the trench 320.

In some cases, the manufacturing system may form the trenches 340 with a dry etch process. For example, the manufacturing system may pattern a dry etch onto the top of the stack of materials (e.g., the top of the silicon material 305-*a*), and then etch through the stack according to the pattern.

Figure 6B:
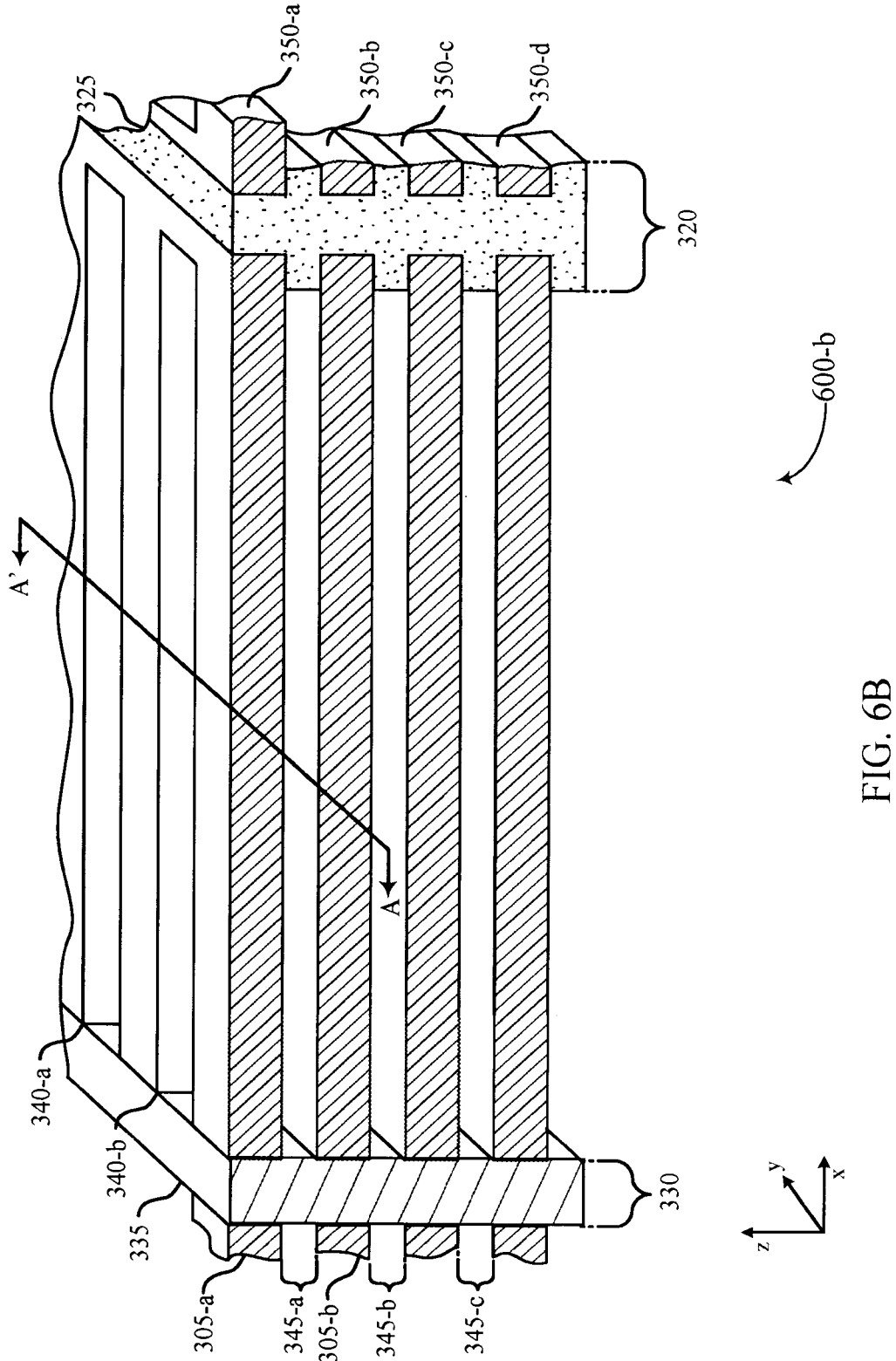

FIG. 6B illustrates an example of a memory device configuration 600-*b* that supports single crystal silicon cores for stacked memory cells in accordance with examples as disclosed herein. The memory device configuration 600-*b* may be an example of or implement aspects of the memory device 100 or memory architecture 200 as described with reference to FIGS. 1 and 2, respectively. Additionally, the memory device configuration 600-*b* may be a continuation of the memory device configuration 600-*a* as described with reference to FIG. 6A.

The manufacturing system may remove (e.g., mostly remove) the remaining portions of the second material 310 (e.g., 310-*a*, 310-*b*, and so on), to form trenches 345 (e.g., trenches 345-*a*, 345-*b*, 345-*c*, and so on). In some cases, the manufacturing system may form the trenches 345 using a wet etch method, a selective etch, or the like (e.g., applied via the trenches 340), to selectively remove the second material 310 throughout the stack of materials.

The remaining portions of the stacked materials (e.g., the silicon materials 305) may each form a respective silicon core 350 (e.g., silicon cores 350-*a*, 350-*b*, 350-*c*, 350-*d*, and so on), where each silicon core 350 (e.g., single crystal silicon core) may be associated with multiple memory cells.

For example, the silicon cores 350 may each extend along an x-direction, and may be divided into subsets of aligned silicon cores each located at a different level along the z-direction. In other words, multiple silicon cores may be formed at each level associated with a layer of the silicon material 305. For example, the remaining portions of the layered silicon material 305-*a* may form the silicon core 350-*a*, and other silicon cores 350, at a first level. Additionally, the remaining portions of the layered silicon material 305-*b* may form the silicon core 350-*b*, and other silicon cores 350, at a second level.

In some cases, the subsets of silicon cores 350 may form a lattice structure of silicon cores 350, such that the multiple silicon cores are organized into columns (e.g., subsets) of silicon cores 350 extending along the z-direction and rows (e.g., subsets) of silicon cores 350 extending along the y-direction. For example, a first column of silicon cores 350 may include silicon cores 350-*a*, 350-*b*, 350-*c*, and 350-*d*, and additional columns of silicon cores 350 (not shown) may neighbor the first column along the y-direction. Similarly, a top row of silicon cores 350 may include the silicon core 350-*a*, and any silicon cores 350 at the top of the neighboring columns, while a second row of silicon cores 350 (e.g., along the z-direction) may include silicon core 350-*b*, any second silicon cores 350 of the neighboring columns (e.g., at the same level), and so on.

In some cases, each silicon core 350 may extend between the trench 330 (e.g., the material 335) and the trench 320 (e.g., the dielectric material 325). For example, a first end of each of the silicon cores 350 may be coupled with the dielectric material 325. Additionally, the other end of each of the silicon cores 350 may be coupled with a remaining portion of the silicon material 305 extending along the trench 320 along the y-direction. At this stage of the manufacturing process, the dielectric material 325 and the material 335 may provide structural support for the silicon cores 350 and remaining silicon materials 305.

Figure 7A:
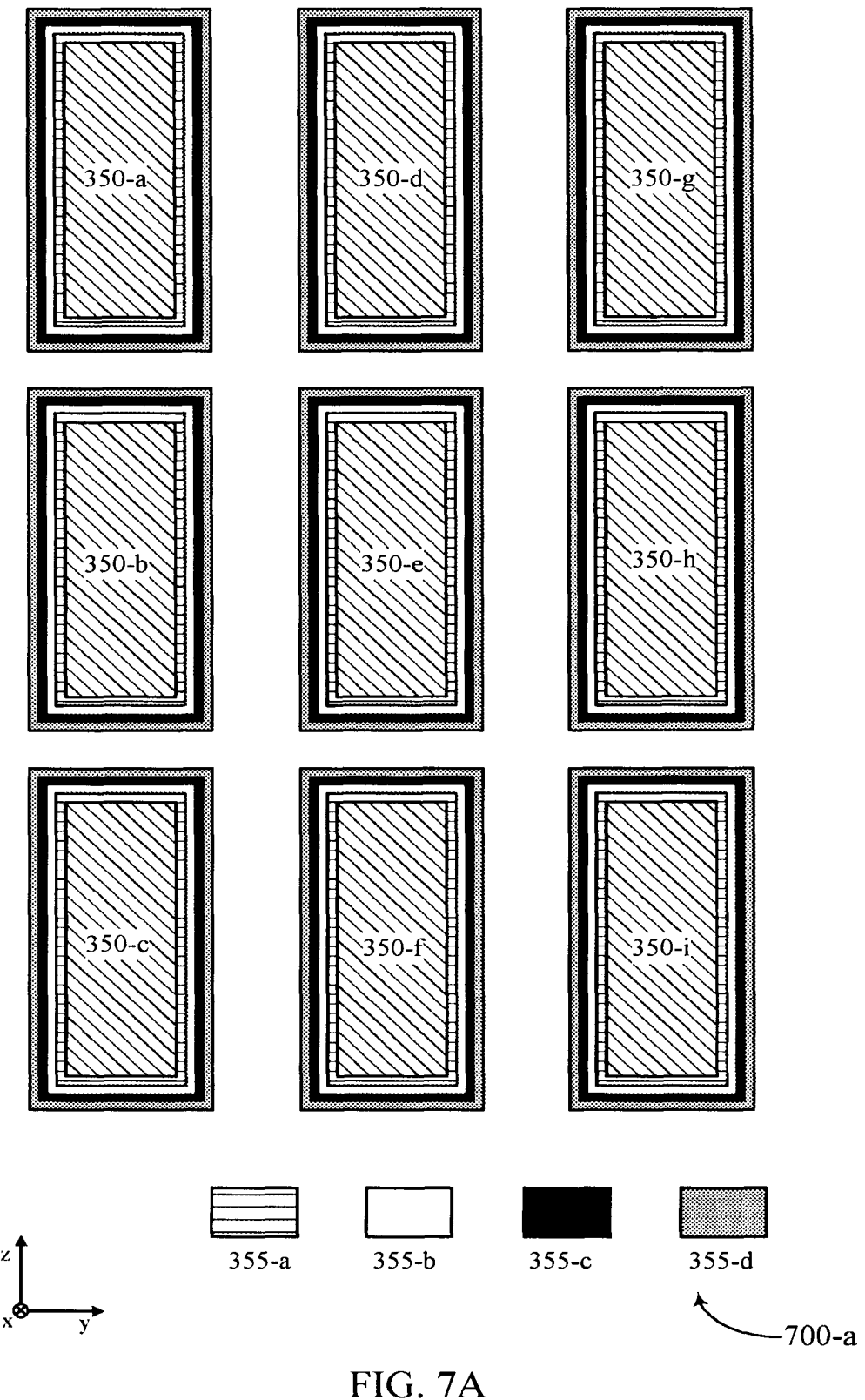

FIG. 7A illustrates an example of a memory device configuration 700-*a* that supports single crystal silicon cores for stacked memory cells in accordance with examples as disclosed herein. The memory device configuration 700-*a* may be an example of or implement aspects of the memory device 100 or memory architecture 200 as described with reference to FIGS. 1 and 2, respectively. Additionally, the memory device configuration 700-*a* may be a continuation of the memory device configuration 600-*b* as described with reference to FIG. 6B. The memory device configuration 700-*a* is an example of cross-sectional view of the memory device configuration 600-*b* along the line A-A'.

As described with reference to FIG. 6B, the manufacturing system may form a lattice of silicon cores 350 extending along the x-direction. For example, silicon cores 350-*a*, 350-*b*, and 350-*c* may be grouped in a first column of silicon cores 350; silicon cores 350-*d*, 350-*e*, and 350-*f* may be grouped in a second column of silicon cores 350; and silicon cores 350-*g*, 350-*h*, and 350-*i* may be grouped in a third column of silicon cores 350. Additionally, silicon cores 350-*a*, 350-*d*, and 350-*g* may be grouped in a first row of silicon cores 350; silicon cores 350-*b*, 350-*e*, and 350-*h* may be grouped in a second row of silicon cores 350; and silicon cores 350-*c*, 350-*f*, and 350-*i* may be grouped in a third row of silicon cores 350. In some cases, the plurality of silicon cores 350 may include additional silicon cores 350 in a respective row or column, as well as additional rows, columns, or both.

The manufacturing system may apply a rounding process to each of the silicon cores 350. For example, the corners of each of the silicon cores 350 may be rounded (e.g., dulled). After the rounding process, the manufacturing system may selectively deposit (e.g., grow) layers of respective multiple memory materials 355 around the silicon cores 350 in a sleeve. For example, the memory materials 355 may include a variety of aligned memory materials that each surround a respective portion of a corresponding silicon core 350 in at least one direction.

For example, a first memory material 355-a may be deposited in a first layer in a sleeve around a respective silicon core 350. Additional memory materials 355, including one or more of memory materials 355-b, 355-c, and 355-d may be deposited in additional layers in a sleeve around the first layer of the memory material 355-a and any subsequent layer of memory material 355. The sleeve of memory materials 355 may surround four sides of each silicon core 350. For example, the memory materials 355 may surround each silicon core 350 along at least the z-direction and the y-direction. Additionally or alternatively, the memory materials 355 may surround each silicon core 350 along a radial direction (e.g., in a cylindrical coordinate system aligned with a respective center of a respective silicon core 350). As used herein, having a first material surrounded by a second material or a second material that is around the first material may refer to the second material encompassing one or more dimensions of the first material. The second material may be said to be around the first material or the first material may be surrounded by the second material and have one or more openings in the second material that may expose portions of the first material. In some cases, each respective silicon core 350 may be associated with a respective group of memory materials 355 (e.g., memory materials 355-a, 355-b, 355-c, and 355-d), creating subsets of aligned memory materials 355 each located at a different level along the z-direction (e.g., each surrounding a respective silicon core 350 that is stacked with other silicon cores 350 along the z-direction).

In some cases, one or more of the memory materials 355 may include a gate material associated with multiple memory cells. For example (e.g., for charge trapping NAND), the memory materials 355 may include respective materials such as a tunnel oxide (e.g., a tunnel material, oxidized crystalline silicon), a storage nitride (e.g., a charge trapping material), a blocking oxide (e.g., an oxide material), a high-kappa material (e.g., aluminum oxide), or a combination thereof. In one example, memory material 355-a may be a tunnel material, memory material 355-b may be a charge trapping material, memory material 355-c may be an oxide material, and memory material 355-d may be a high-kappa material. One or more of the memory materials 355 may be different materials, or may be made of the same material. In some cases, the memory materials 355 may be associated with charge trapping NAND cells. Alternatively, the memory materials 355 may be associated with floating gate NAND cells (e.g., and different, respective examples of memory materials 355 may be used to support the floating gate NAND cells).

Figure 7B:
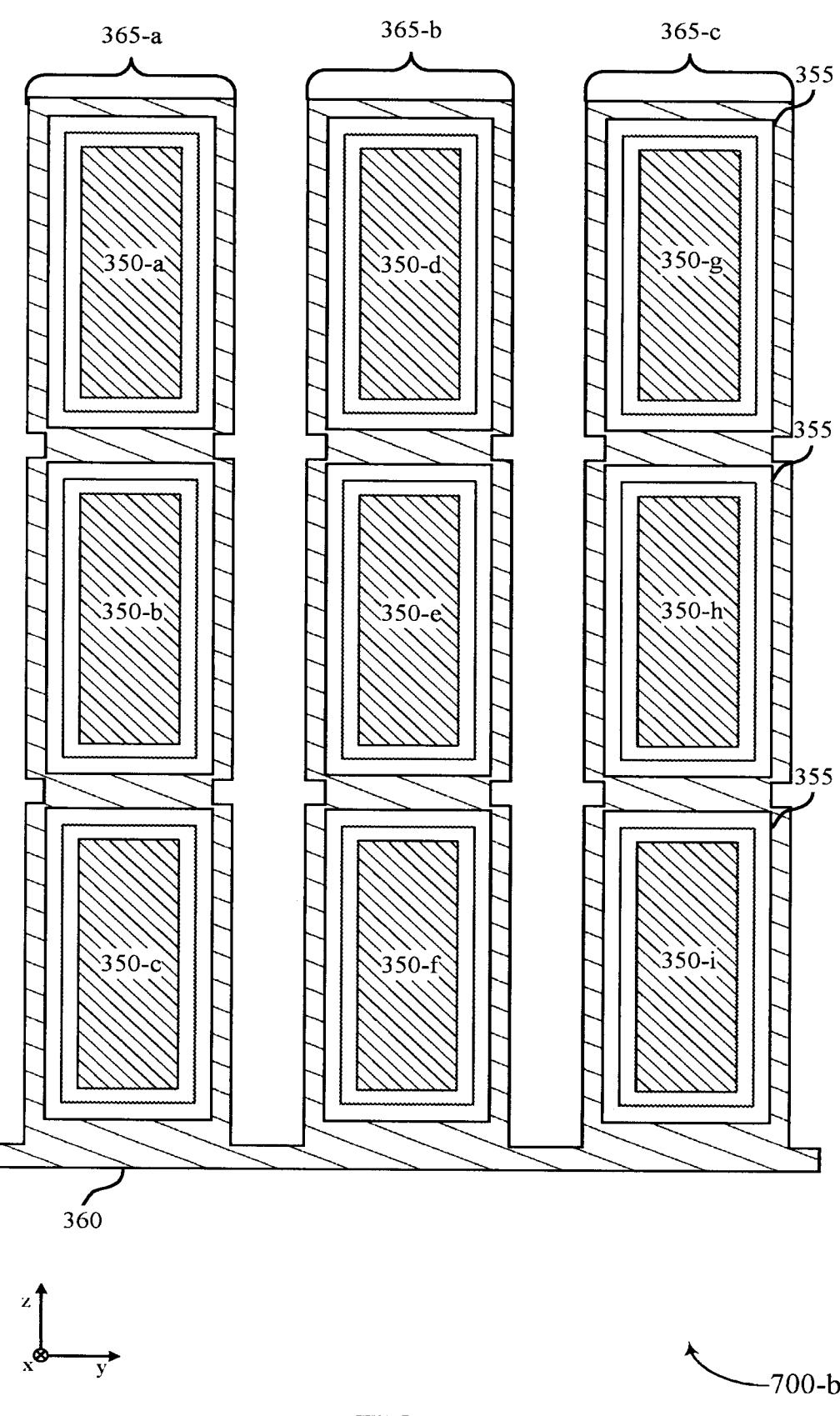

FIG. 7B illustrates an example of a memory device configuration 700-b that supports single crystal silicon cores for stacked memory cells in accordance with examples as disclosed herein. The memory device configuration 700-b may be an example of or implement aspects of the memory device 100 or memory architecture 200 as described with reference to FIGS. 1 and 2, respectively. Additionally, the memory device configuration 700-b may be a continuation of the memory device configuration 700-a as described with reference to FIG. 7A. The memory device configuration 700-b is an example of cross-sectional view of the memory device configuration 600-b along the line A-A'.

The manufacturing system may form a block of conductive material 360 around the memory materials 355 and the silicon cores 350 to form word lines for associated memory cells. For example, the manufacturing system may selectively deposit (e.g., grow) a respective conductive material associated with each respective subset of memory materials 355 and associated silicon cores 350 (e.g., subsets of silicon cores 350 and associated memory materials 355 that are aligned along the z-direction). In some cases, the conductive material 360 may form a sleeve around each respective silicon core 350 and the respective memory materials 355 along at least the y-direction and the z-direction (e.g., along a radial direction).

In some cases, a height and width of the silicon cores 350 (e.g., and associated memory materials 355) may be dimensioned such that the conductive material 360 may grow together (e.g., pinch off) along the z-direction, and may be separate (e.g., from other subsets or stacks of silicon cores 350) along the y-direction. For example (e.g., for charge trapping NAND), each of the silicon cores may be approximately 55 nanometers (nm) in width and 20 nm in height. Additionally, each silicon core 350 may be separated from neighboring silicon cores 350 along the y-direction by approximately 75 nm. In some cases (e.g., if the silicon cores 350 are associated with floating gate NAND), each of the silicon cores may by approximately 35 nm in width and 15 nm in height. Additionally, in these cases, each silicon core 350 may be separated from neighboring silicon cores 350 along the z-direction by approximately 50 nm, which may accommodate for additional layers of memory materials 355.

These dimensions may result in the conductive material 360 coupling with two or more silicon cores 350 (e.g., coupling together groups of two or more silicon cores 350). For example, silicon cores 350-a, 350-b, and 350-c may be bonded by the conductive material 360 into a first column 365-a, silicon cores 350-d, 350-e, and 350-f may be grouped into a second column 365-b, and silicon cores 350-g, 350-h, and 350-i may be grouped into a third column 365-c. In some examples, the columns 365-a, 365-b, and 365-c may additionally be connected together at one end. For example, a portion of the conductive material 360 may extend across the bottom of the columns 365-a, 365-b, and 365-c along the x-direction. In some cases, the conductive material 360 may be a gate-all-around metal (e.g., titanium nitride or tungsten). As previously described herein, the columns 365 may, in some cases, include additional quantities of silicon cores 350 and associated memory materials 355. For example, a column 365 (e.g., a subset of aligned silicon cores 350 and associated memory materials 355) may include any quantity of two or more silicon cores 350 and associated memory materials 355. In some cases, the memory device may also include additional columns 365. For example, the memory device may include any quantity of two or more columns 365.

Figure 8A:
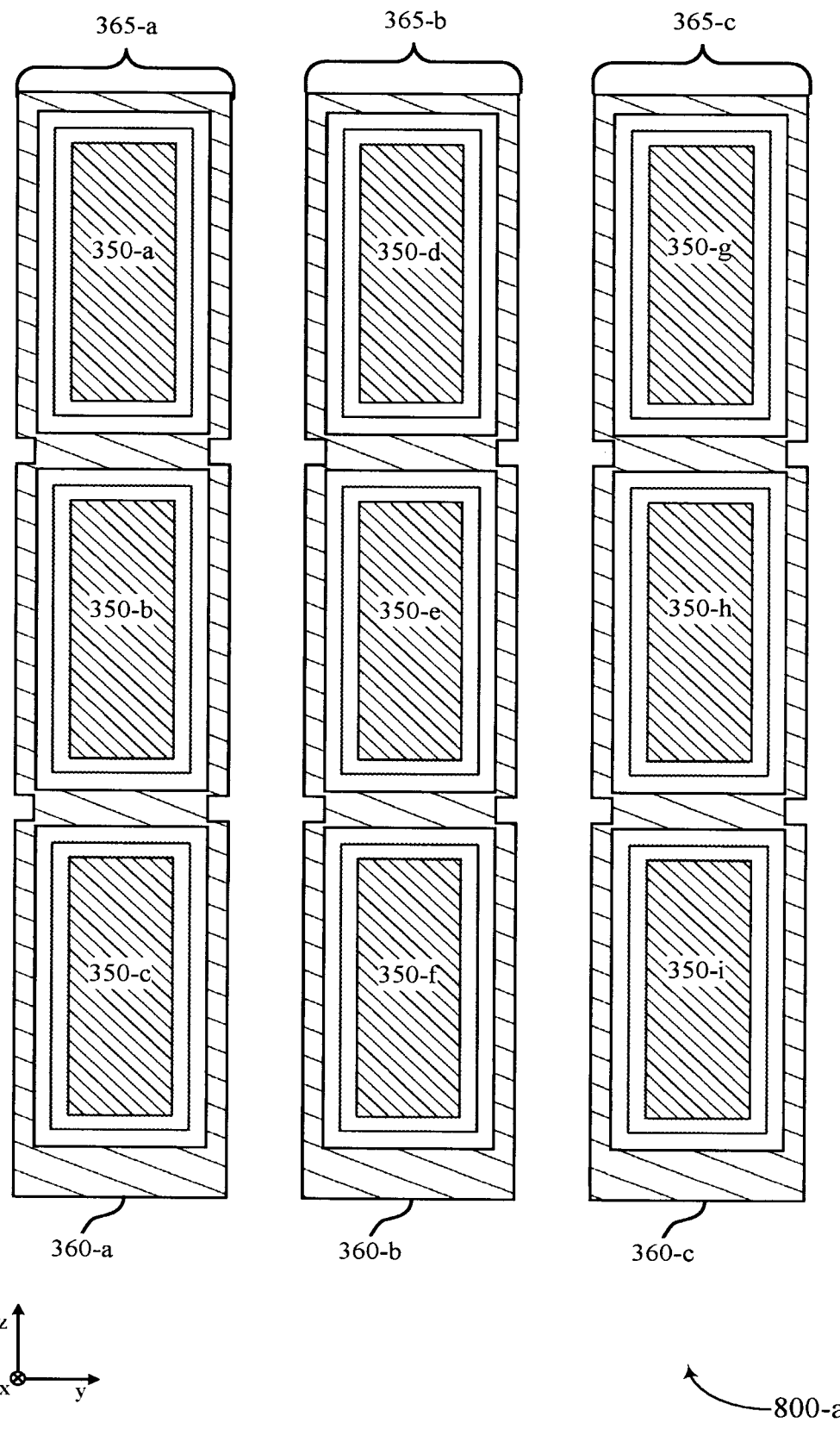

FIG. 8A illustrates an example of a memory device configuration 800-a that supports single crystal silicon cores for stacked memory cells in accordance with examples as disclosed herein. The memory device configuration 800-a may be an example of or implement aspects of the memory device 100 or memory architecture 200 as described with reference to FIGS. 1 and 2, respectively. Additionally, the memory device configuration 800-a may be a continuation of the memory device configuration 700-b as described with reference to FIG. 7B. The memory device configuration 700-*c* is an example of cross-sectional view of the memory device configuration 600-*b* along the line A-A'.

The manufacturing system may remove (e.g., etch) one or more portions of the portion of the conductive material 360 connecting the columns 365-*a*, 365-*b*, and 365-*c* along the x-direction (e.g., at the bottom of the columns 365). For example, by removing the one or more portions of the conductive material 360, the column 365-*a* with conductive material 360-*a*, column 365-*b* with conductive material 360-*b*, and column 365-*c* with conductive material 360-*c* may become electrically isolated from each other. In some cases, the etching process may be an example of a patterned dry etch process. Alternatively, the etching process may be an example of a wet etch process.

Figure 8B:
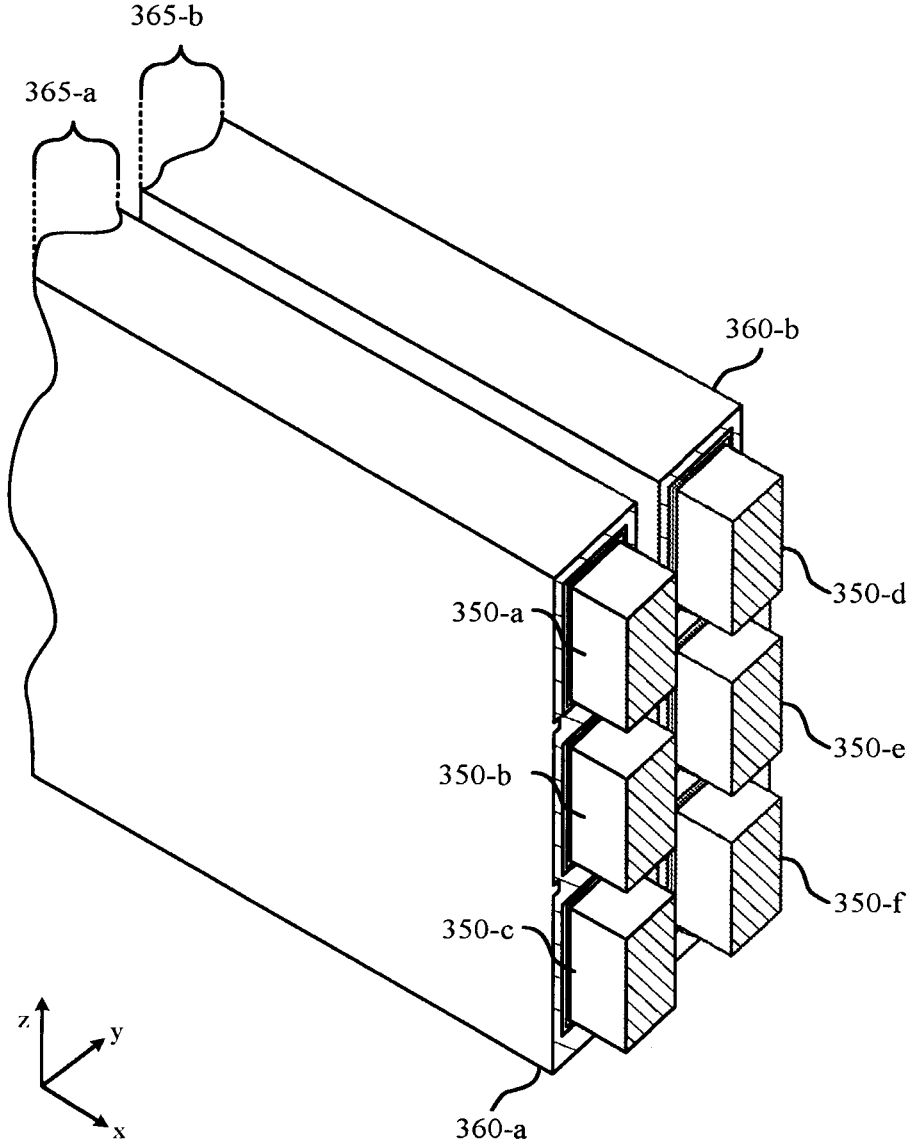

FIG. 8B illustrates an example of a memory device configuration 800-*b* that supports single crystal silicon cores for stacked memory cells in accordance with examples as disclosed herein. The memory device configuration 800-*b* may be an example of or implement aspects of the memory device 100 or memory architecture 200 as described with reference to FIGS. 1 and 2, respectively. Additionally, the memory device configuration 800-*b* may be a continuation of the memory device configuration 800-*a* as described with reference to FIG. 8A.

As described with reference to FIG. 8A, each of the silicon cores 350 may be surrounded by a sleeve of one or more layers of memory materials 355 in at least the z-direction and the y-direction (e.g., in a radial direction). Additionally, each sleeve of memory materials 355 may be further surrounded by a sleeve of conductive material 360 in at least the z-direction and the y-direction (e.g., in a radial direction). In some cases, the respective sleeves of conductive material 360 may be connected along the z-direction, creating a column of silicon cores 350, and their respective memory materials 355, coupled with a respective sleeve of conductive material 360. For example, the sleeve of conductive material 360 of silicon cores 350-*a*, 350-*b*, and 350-*c* may be coupled along the z-direction, forming the column 365-*a* of silicon cores 350. Additionally, the sleeve of conductive material 360 of silicon cores 350-*d*, 350-*e*, and 350-*f* may be coupled along the z-direction, forming the column 365-*b* of silicon cores 350, and so on. Each of the columns 365 may be separated by a gap along the y-direction.

Figure 8C:
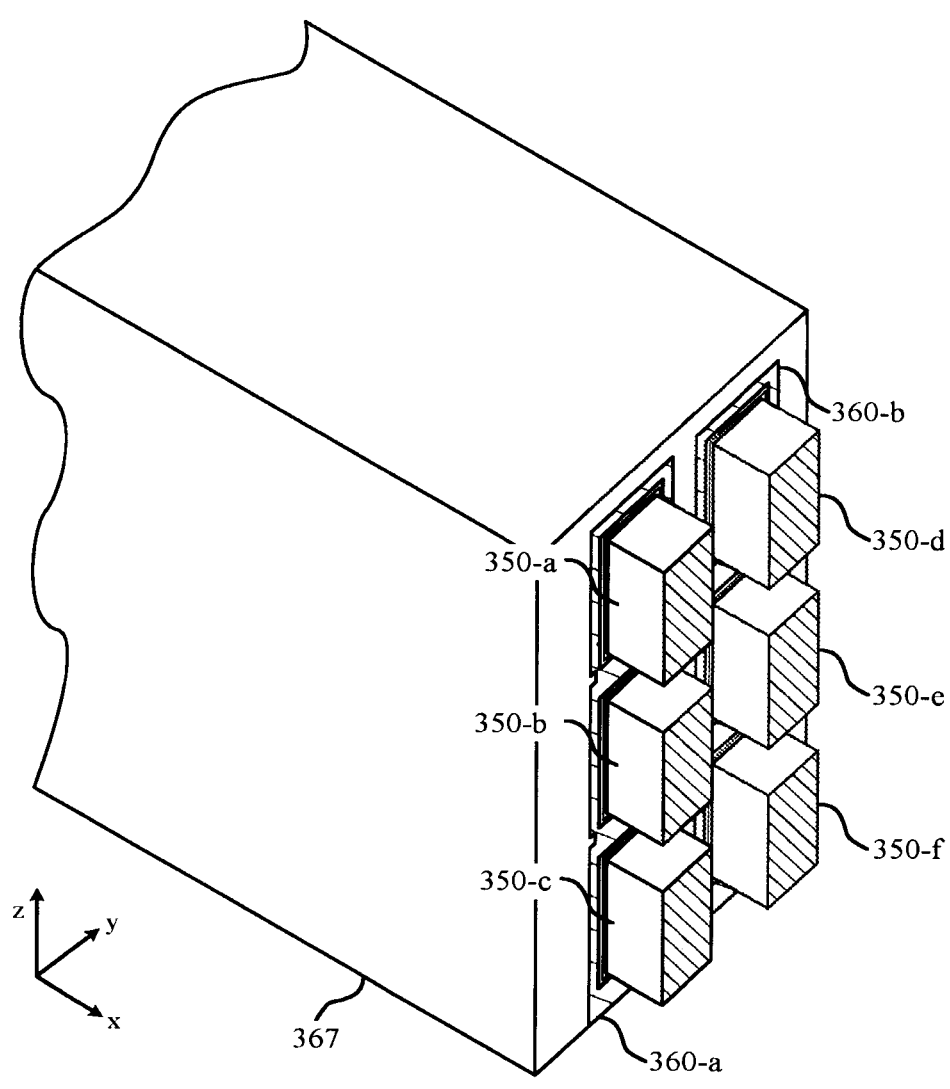

FIG. 8C illustrates an example of a memory device configuration 800-*c* that supports single crystal silicon cores for stacked memory cells in accordance with examples as disclosed herein. The memory device configuration 800-*c* may be an example of or implement aspects of the memory device 100 or memory architecture 200 as described with reference to FIGS. 1 and 2, respectively. Additionally, the memory device configuration 800-*c* may be a continuation of the memory device configuration 800-*b* as described with reference to FIG. 8B.

The manufacturing system may form a material 367 between and around each of the columns 365. For example, the material 367 may be an oxide (e.g., dielectric, insulative). In some cases, the manufacturing may form and planarize the material 367 using a CMP process. For example, after forming the material 367, the CMP process may apply chemical oxidation to the material 367, and apply mechanical abrasion across the surface of the material 367. The CMP process may result in a high level of planarity between the deposited material 367 and the surrounding materials to create flush (e.g., relatively flush) surfaces along the z-direction and along the y-direction (e.g., xz-plane and/or xy-plane).

Figures 9A, 9B:
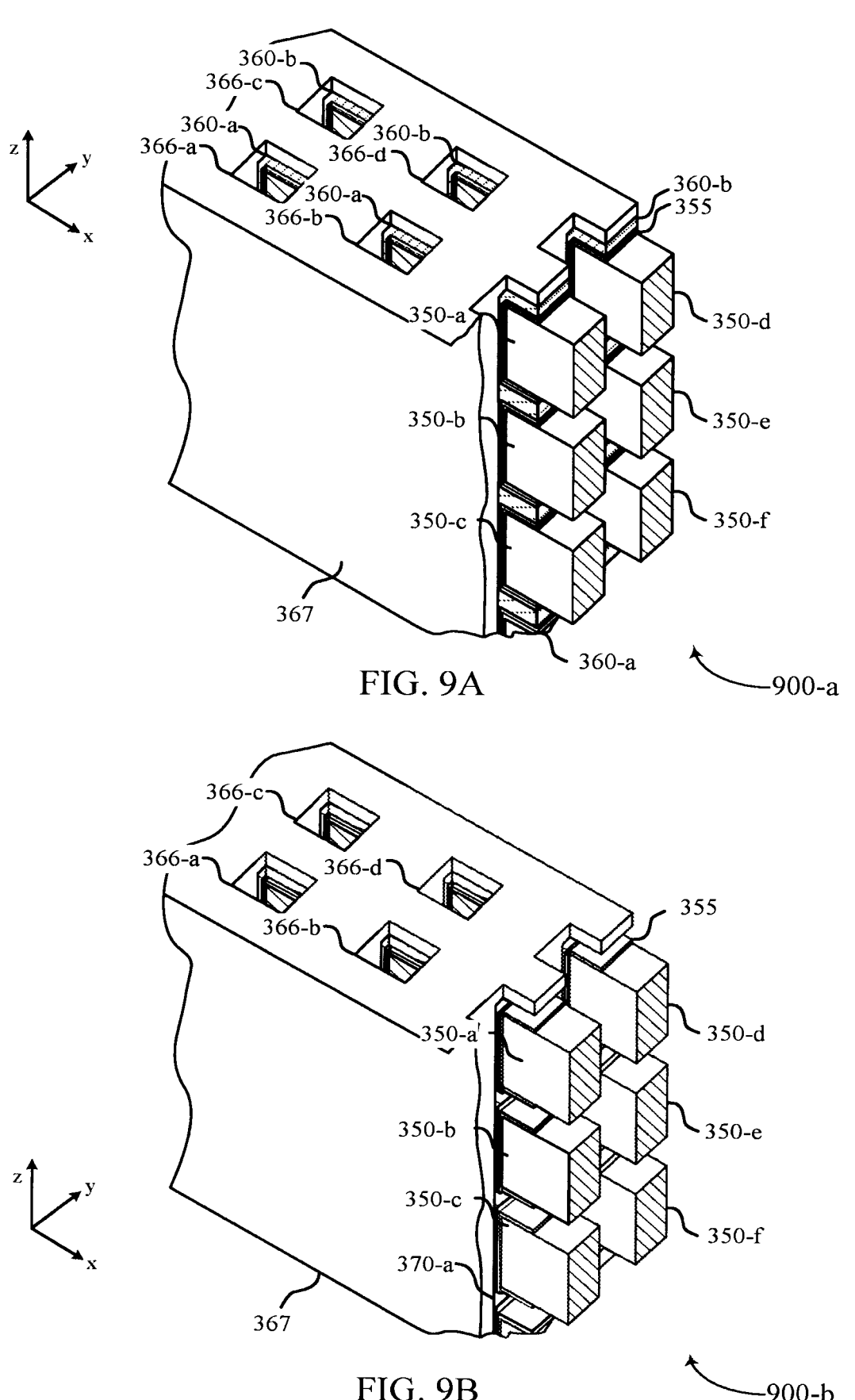

FIG. 9A illustrates an example of a memory device configuration 900-*a* that supports single crystal silicon cores for stacked memory cells in accordance with examples as disclosed herein. The memory device configuration 900-*a* may be an example of or implement aspects of the memory device 100 or memory architecture 200 as described with reference to FIGS. 1 and 2, respectively. Additionally, the memory device configuration 900-*a* may be a continuation of the memory device configuration 800-*c* as described with reference to FIG. 8C.

The manufacturing system may form multiple holes 366 through the material 367 and the stack of materials, along the z-direction. In some examples, the manufacturing system may etch (e.g., dry etch) one or more holes 366 on either side of each respective silicon core 350. For example, holes 366-*a* and 366-*b* may be along a first side of the silicon cores 350-*a*, 350-*b*, and 350-*c*, while holes 366-*c* and 366-*d* may be along a second side of the silicon cores 350-*a*, 350-*b*, and 350-*c*, in between the silicon cores 350-*a*, 350-*b*, and 350-*c*, and the silicon cores 350-*d*, 350-*e*, and 350-*f*.

Each of the holes 366 may cut through (e.g., remove) a portion of the conductive materials 360 and the memory materials 355 of each neighboring silicon core 350. For example, forming the holes may remove, on two respective sides of each silicon core, a portion of the material 367, a respective first portion of the respective column of conductive material 360, and a respective first portion of the memory materials 355, which may expose the silicon cores 350 (e.g., materials may be removed up to the silicon cores 350, or including a portion of the silicon cores 350). The trenches holes 366 may be formed to be relatively straight (e.g., as straight as possible), such that the associated length and spacing may be relatively uniform (e.g., as uniform as possible) for the removal of conductive material 360 and memory materials 355. In one example, the holes 366 may be formed using low temperature substrate etches (e.g., nebula etches) to achieve a relatively straight configuration.

In some cases, after forming the holes 366, a portion of the conductive material 360 and the memory materials 355 that extends along the x-direction may remain, above and below each respective silicon core along the z-direction.

FIG. 9B illustrates an example of a memory device configuration 900-*b* that supports single crystal silicon cores for stacked memory cells in accordance with examples as disclosed herein. The memory device configuration 900-*b* may be an example of or implement aspects of the memory device 100 or memory architecture 200 as described with reference to FIGS. 1 and 2, respectively. Additionally, the memory device configuration 900-*b* may be a continuation of the memory device configuration 900-*a* as described with reference to FIG. 9A.

The manufacturing system may remove (e.g., etch) at least a portion of the remaining conductive material 360 and memory materials 355 extending above and below each silicon core 350, between respective holes 366 along the y-direction. For example, the manufacturing system may apply (e.g., via the holes 366) a selective, directional etch method (e.g., a wet etch method, vapor etch method) to remove the remaining conductive material 360 extending above and below each silicon core 350. Additionally, the etch method may remove one or more of the memory materials 355 from the remaining memory materials 355 extending above and below each silicon core 350. The removed materials may be located between holes 366 along the y-direction, but not along the x-direction, such that conductive materials 360 and memory materials 355 may remain above and below the respective silicon cores 350 between holes 366 along the x-direction. The removed top and bottom portions of the materials 360 and 355 may connect (e.g., align) with the removed side portions of the materials 360 and 355 of the respective silicon core 350. For example, the removed top, bottom, and side portions of the materials 360 and 355 may form gaps surrounding a respective portion of each silicon core along at least the z-direction and the y-direction (e.g., along a radial direction).

In some examples, the gaps may separate the respective conductive materials 360 and the memory materials 355 of each silicon core 350 into separate sections along the x-direction to form multiple conductive lines associated with each of the silicon cores 350. For example, each of the remaining portions of the conductive materials 360 may form a conductive line 370 that extends across multiple silicon cores 350 along the z-direction. In this example, a conductive line 370-*a* may surround each respective portion of each of the silicon cores 350-*a*, 350-*b*, and 350-*c* along the z-direction, and so on for other conductive lines 370. Further, each of the conductive lines 370 may be associated with multiple respective memory cells (e.g., each at a different location and different silicon core 350 along the z-direction).

Figure 9C:
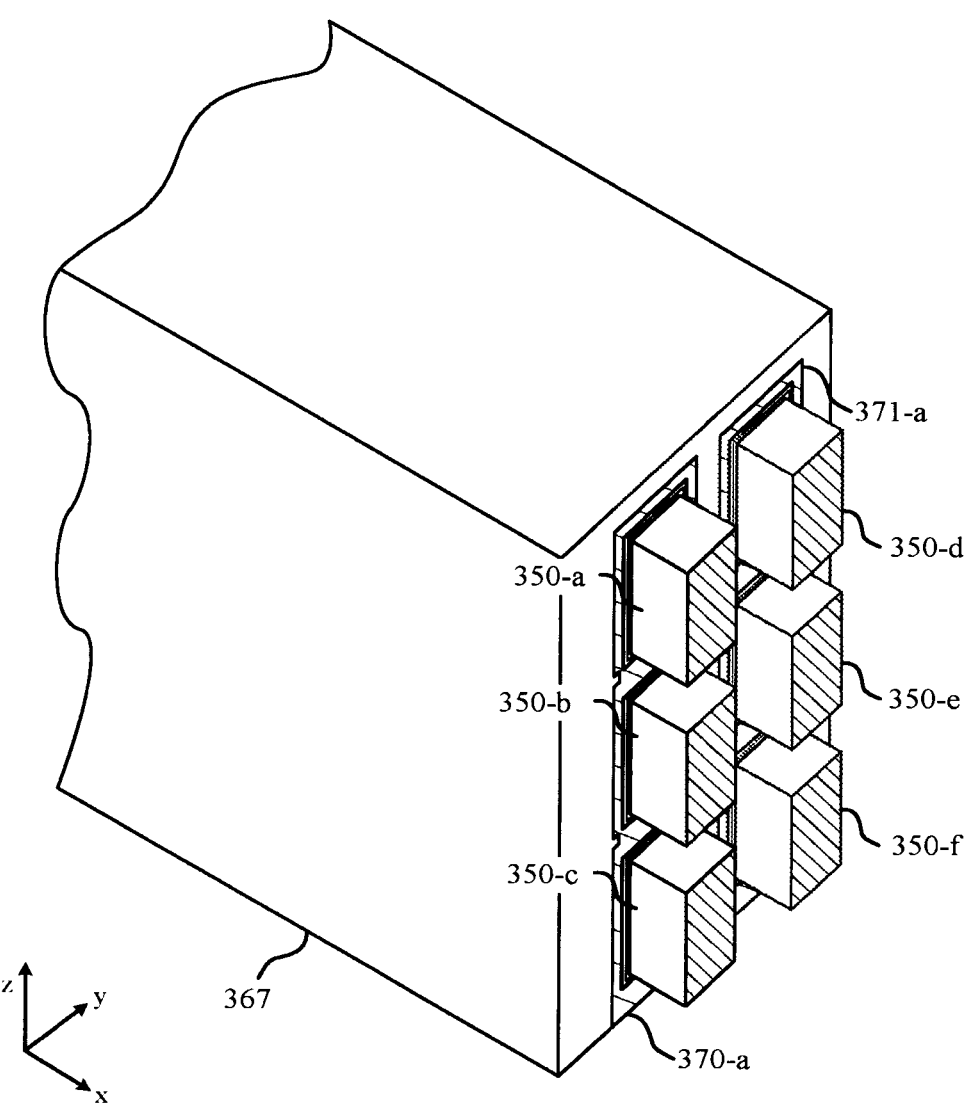

FIG. 9C illustrates an example of a memory device configuration 900-*c* that supports single crystal silicon cores for stacked memory cells in accordance with examples as disclosed herein. The memory device configuration 900-*c* may be an example of or implement aspects of the memory device 100 or memory architecture 200 as described with reference to FIGS. 1 and 2, respectively. Additionally, the memory device configuration 900-*c* may be a continuation of the memory device configuration 900-*b* as described with reference to FIG. 9B.

Once the portions of the conductive materials 360 and the memory materials 355 have been removed from each of the silicon cores 350, the manufacturing system may form the material 367 in each of the holes 366. For example, the manufacturing system may form a second portion of the material 367, and the material 367 may be a continuation of the oxide (e.g., dielectric, insulative). Additionally, the material 367 may be formed in each of the gaps formed by removing the portions of the conductive materials 360 and the memory materials 355 from above and below each of the silicon cores 350 (e.g., in addition to the holes 366).

In some cases, the manufacturing system may form and planarize the material 367 using a CMP process. For example, after forming the material 367 in the holes 366 and the other gaps, the CMP process may apply chemical oxidation to the material 367, and apply mechanical abrasion across the surface of the material 367. The CMP process may result in a high level of planarity between the newly deposited material 367 and the previously deposited silicon material 305 create a flush (e.g., relatively flush) surface along the z-direction and along the y-direction (e.g., in an xz-plane and an xy-plane).

Figure 10:
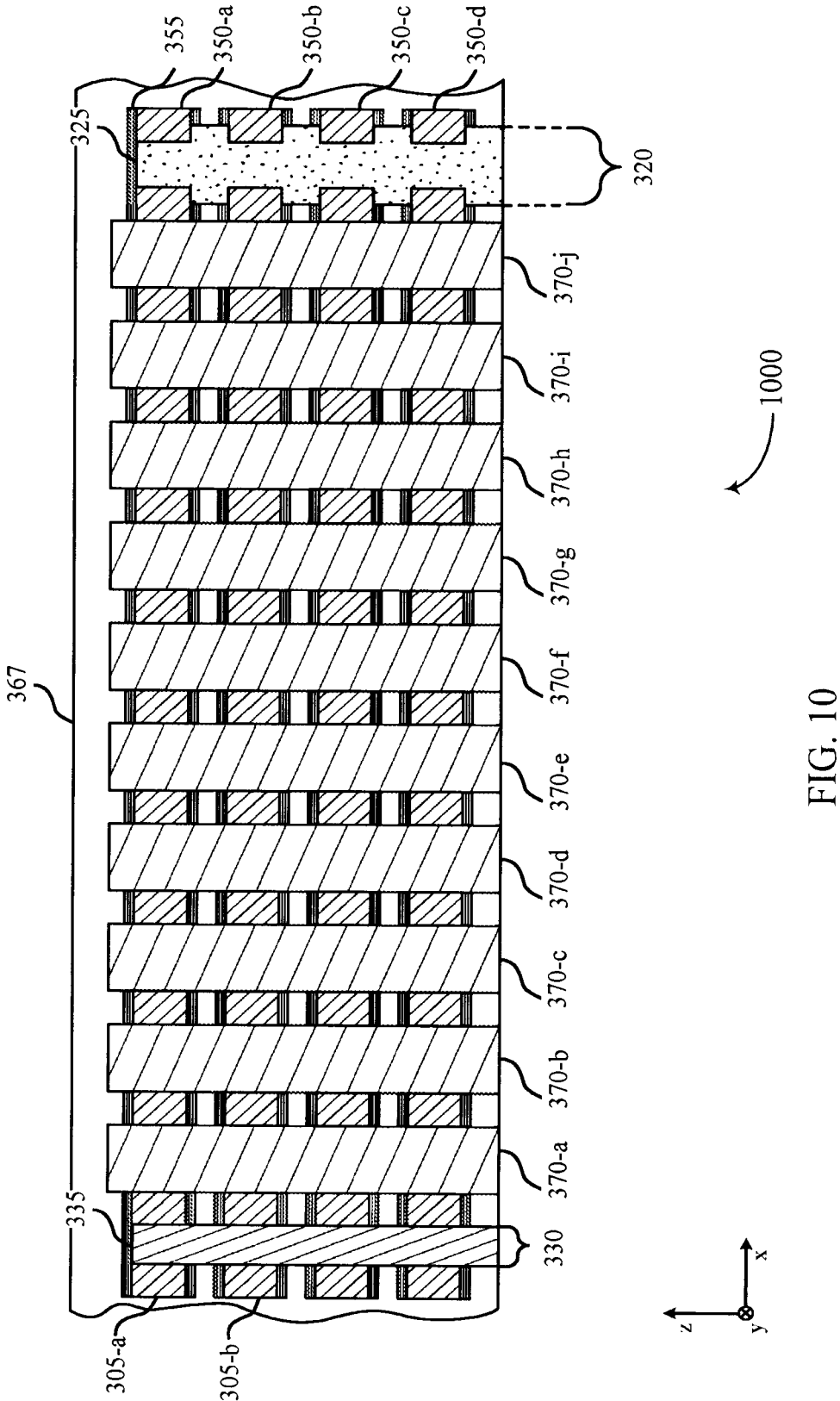

FIG. 10 illustrates an example of a memory device configuration 1000 that supports single crystal silicon cores for stacked memory cells in accordance with examples as disclosed herein. The memory device configuration 1000 may be an example of or implement aspects of the memory device 100 or memory architecture 200 as described with reference to FIGS. 1 and 2, respectively. Additionally, the memory device configuration 1000 may be a continuation of the memory device configuration 900-*c* as described with reference to FIG. 9C.

The memory device configuration 1000 illustrates a cross-section of the various materials formed within the material

367 (e.g., as illustrated by FIG. 9C). For example, the first trench 320, filled with the dielectric material 325, may extend along the z-direction and the y-direction on a first end of the memory device configuration 1000. In some examples, the manufacturing system may form drain contacts within the trench 320 to support accessing the respective silicon cores 350 and associated memory cells. Additionally, the second trench 330, filled with the material 335, may extend along the z-direction and y-direction on a second end of the memory device configuration 1000. In some examples, the manufacturing system may form source contacts within the second trench 330 to support accessing the respective silicon cores 350 and associated memory cells.

The multiple silicon cores 350 may extend along the x-direction, and in some examples, may extend between the first trench 320 and the second trench 330. For example. a first end of each silicon core 350 may connect with the dielectric material 325 while a second end of the respective silicon cores 350 may connect with the material 335. Each of the silicon cores 350 may be associated with sets of memory materials 355 that surround the silicon cores 350 in at least one direction (e.g., in a y-direction and z-direction, in a radial direction). For example, a layer of one or more memory materials 355 may be located above and below a respective silicon core 350 along the z-direction and on both sides of the silicon core 350 along the y-direction, and may extend along the respective silicon core 350 along the x-direction for a respective distance. Each remaining portion of the one or more memory materials 355 may form portions of a respective memory cell that is associated with the silicon core 350.

The remaining portions of the conductive material 360 may form the conductive lines (e.g., word lines) 370. For example, each conductive line 370 may extend across each silicon core stacked in a z-direction within a particular column of memory materials 355 (e.g., associated with different silicon cores 350 in the z-direction, stacked in the z-direction). In this example, each of the conductive lines 370-*a*, 370-*b*, 370-*c*, 370-*d*, 370-*e*, 370-*f*, 370-*g*, 370-*h*, 370-*i*, and 370-*j* may extend across a respective portion of the silicon cores 350-*a*, 350-*b*, 350-*c*, and 350-*d* at a respective location along the x-direction. Additionally, each of the conductive lines 370 may surround each of the associated silicon cores 350, and the respective layers of memory materials 355, at each location of intersection. For example, a first portion of at least the silicon cores 350-*a*, 350-*b*, and 350-*c*, and their respective memory materials 355, may be surrounded and coupled by a first conductive line 370-*a*. Additionally, a second portion of at least the silicon cores 350-*a*, 350-*b*, and 350-*c*, and their respective memory materials 355, may be surrounded and coupled by a second conductive line 370-*b*, and so on.

Each of the conductive lines 370 may be separated and electrically isolated from each other conductive line 370 along the x-direction to support the formation of multiple memory cells (e.g., multiple stacked memory cells) along each silicon core 350 (e.g., to support separate access for different memory cells). Additionally, each of the conductive lines 370 may be separated and electrically isolated from each other along the y-direction. For example, the conductive lines 370 surrounding the column 365-*a* of at least silicon cores 350-*a*, 350-*b*, and 350-*c* may be separated and electrically isolated from the conductive lines 370 surrounding the column 365-*b* of at least silicon cores 350-*d*, 350-*e*, and 350-*f*. A memory cell (e.g., including one or more memory materials 355) associated with a silicon core 350 and a conductive line 370 may be located at the intersection between the associated silicon core 350 and the associated conductive line 370. For example, the memory cell may be addressed (e.g., activated) by activating the associated respective silicon core 350 (e.g., via a bit line) and a respective conductive line 370 (e.g., a word line).

Each set of memory materials 355 in a column of memory materials 355 and its associated conductive line 370 closest to the material 335 (e.g., for forming source contacts) may form a respective source (e.g., source transistor) for a remaining quantity of memory materials 355 (e.g., memory cells) along the associated silicon core 350 along the x-direction. Similarly, each set of memory materials 355 in a column of memory materials 355 and its associated conductive line 370 closest to the material 325 (e.g., for forming drain contacts) may form a respective drain (e.g., drain transistor) for a remaining quantity of memory materials 355 (e.g., memory cells) along the associated silicon core 350 along the x-direction. While the silicon cores 350 are illustrated as being associated with a quantity of conductive lines 370 and associated groups of memory materials 355 (e.g., memory cells) along the x-direction, any quantity of (e.g., two or more) conductive lines 370 and associated groups of memory materials 355 (e.g., memory cells) may be associated with the silicon cores 350.

Figure 11A:
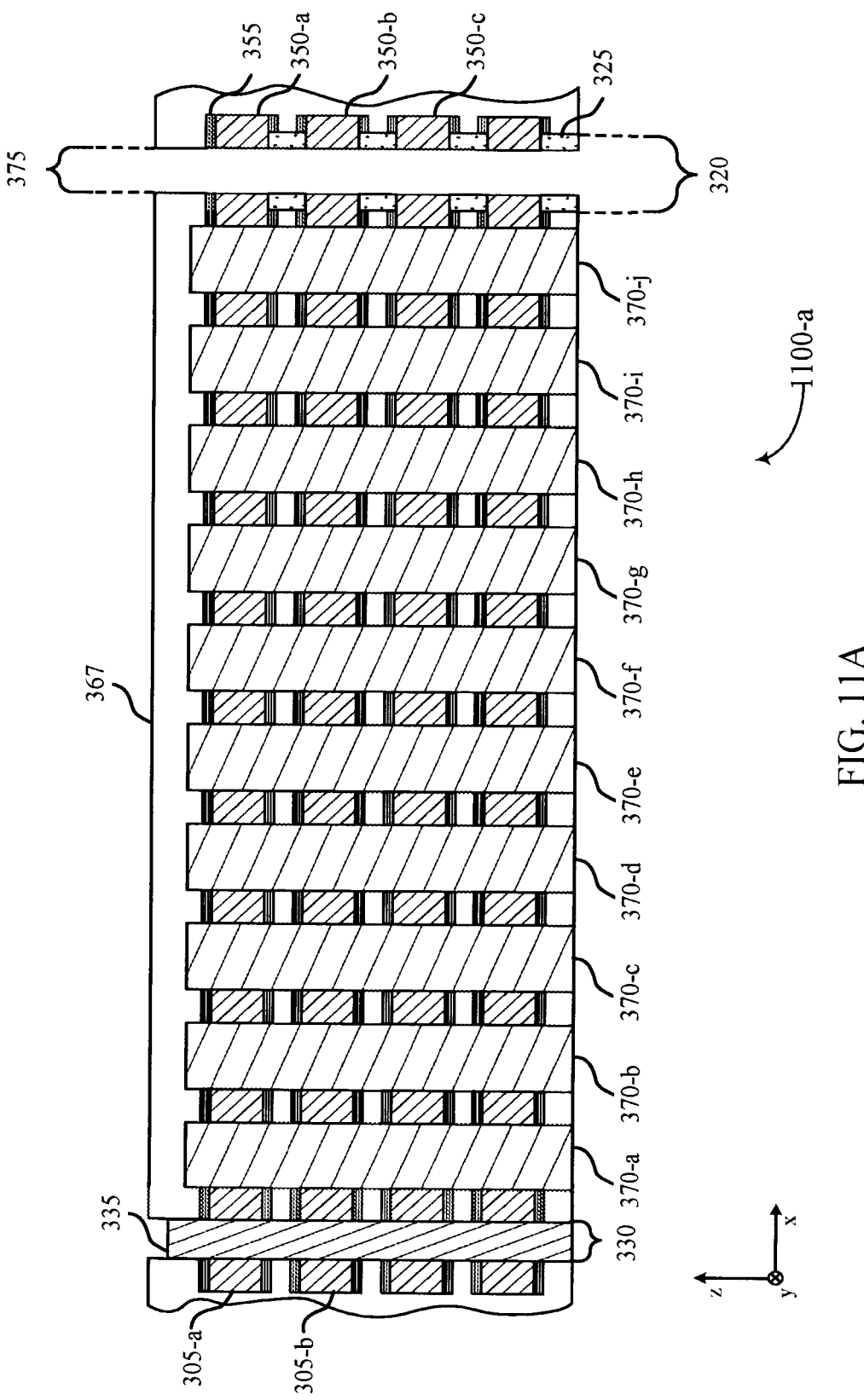

FIG. 11A illustrates an example of a memory device configuration 1100-a that supports single crystal silicon cores for stacked memory cells in accordance with examples as disclosed herein. The memory device configuration 1100-a may be an example of or implement aspects of the memory device 100 or memory architecture 200 as described with reference to FIGS. 1 and 2, respectively. Additionally, the memory device configuration 1100-a may be a continuation of the memory device configuration 1000 as described with reference to FIG. 10.

The manufacturing system may form (e.g., etch) a fourth trench 375 through the stack of materials along the z-direction, extending along the y-direction. For example, the fourth trench 375 may extend through the material 367 and through the dielectric material 325 within the trench 320. In some cases, forming the fourth trench 375 may remove a middle portion from the dielectric material 325. For example, the fourth trench 375 may align with the original placement of the trench 315, leaving the portions of the dielectric material 325 deposited within the recesses 316, as described with reference to FIG. 4A.

In some cases, the manufacturing system may form the fourth trench 375 with a dry etch process. For example, the manufacturing system may pattern a dry etch onto the top of the stack of materials (e.g., the top of the material 367), and etch through the stack according to the pattern.

Figures 11B, 11C:
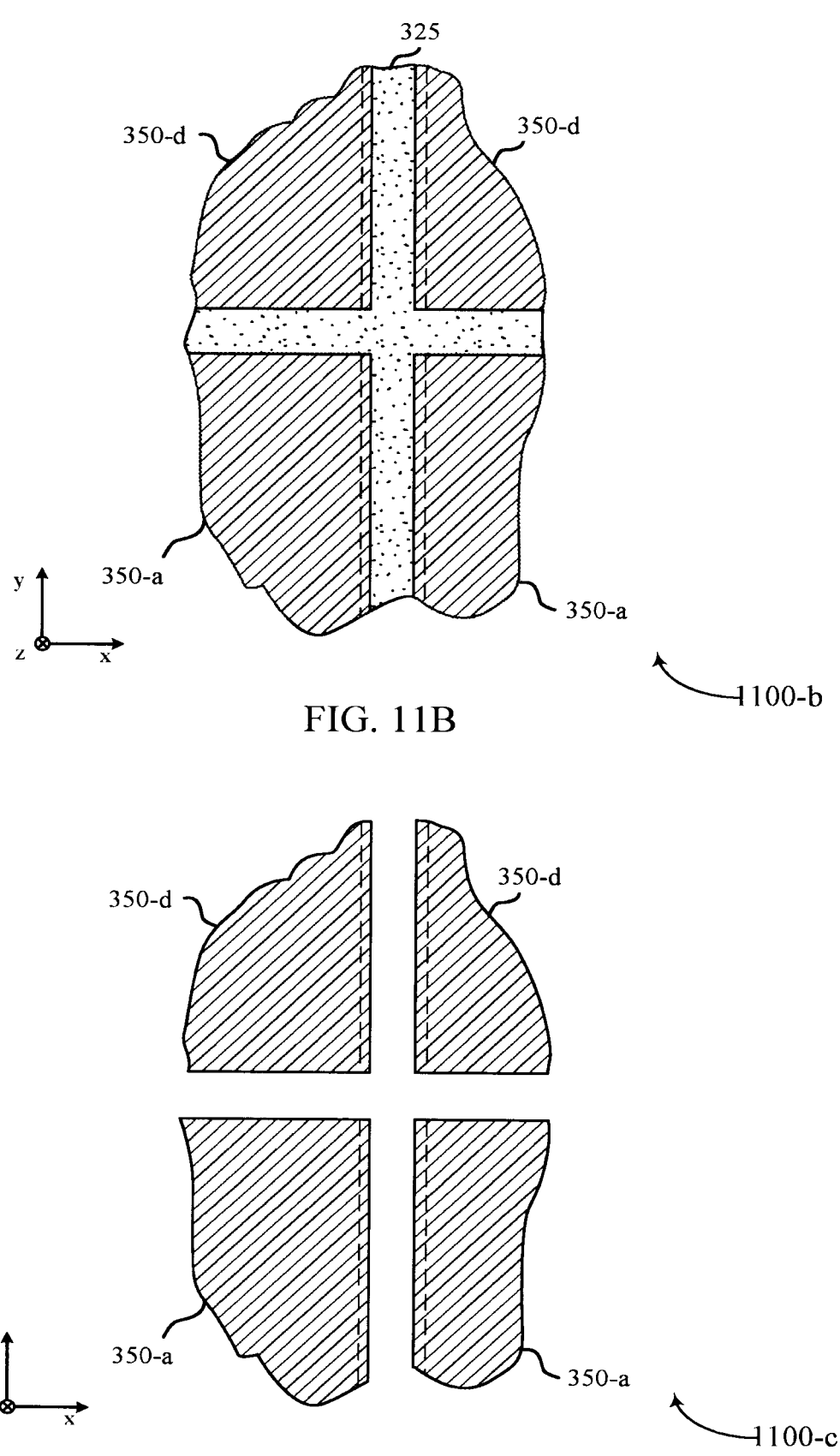

FIGS. 11B and 11C illustrate examples of memory device configurations 1100-b and 1100-c that support single crystal silicon cores for stacked memory cells in accordance with examples as disclosed herein. The memory device configuration configurations 1100-b and 1100-c may be an example of or implement aspects of the memory device 100 or memory architecture 200 as described with reference to FIGS. 1 and 2, respectively. Additionally, the memory device configurations 1100-b and 1100-c may be a continuation of the memory device configuration 1100-a as described with reference to FIG. 11A. Memory device configuration 1100-b may illustrate a top down view (e.g., along the z-direction) of the dielectric material 325, before etching the fourth trench 375. Portions of the dielectric material 325 in the recesses 316 may be illustrated by the dashed lines. Memory device configuration 1100-c may also illustrate a top down view (e.g., along the z-direction) of the dielectric material 325, after etching the fourth trench 375, where the remaining portions of the dielectric material 325 may be illustrated by the dashed lines (e.g., material in the recesses 316). Additionally, memory device configurations 1100-b and 1100-c may each illustrate array plane edges or array plane boundaries. For example, a memory die may have multiple, relatively small planes (e.g., 6 planes per die) to increase memory device speed and to shorten bit lines. In some examples, array plane edges or array plane boundaries may be utilized for contacts at each level of a staircase formation, as described with reference to FIG. 14.

Figure 12A:
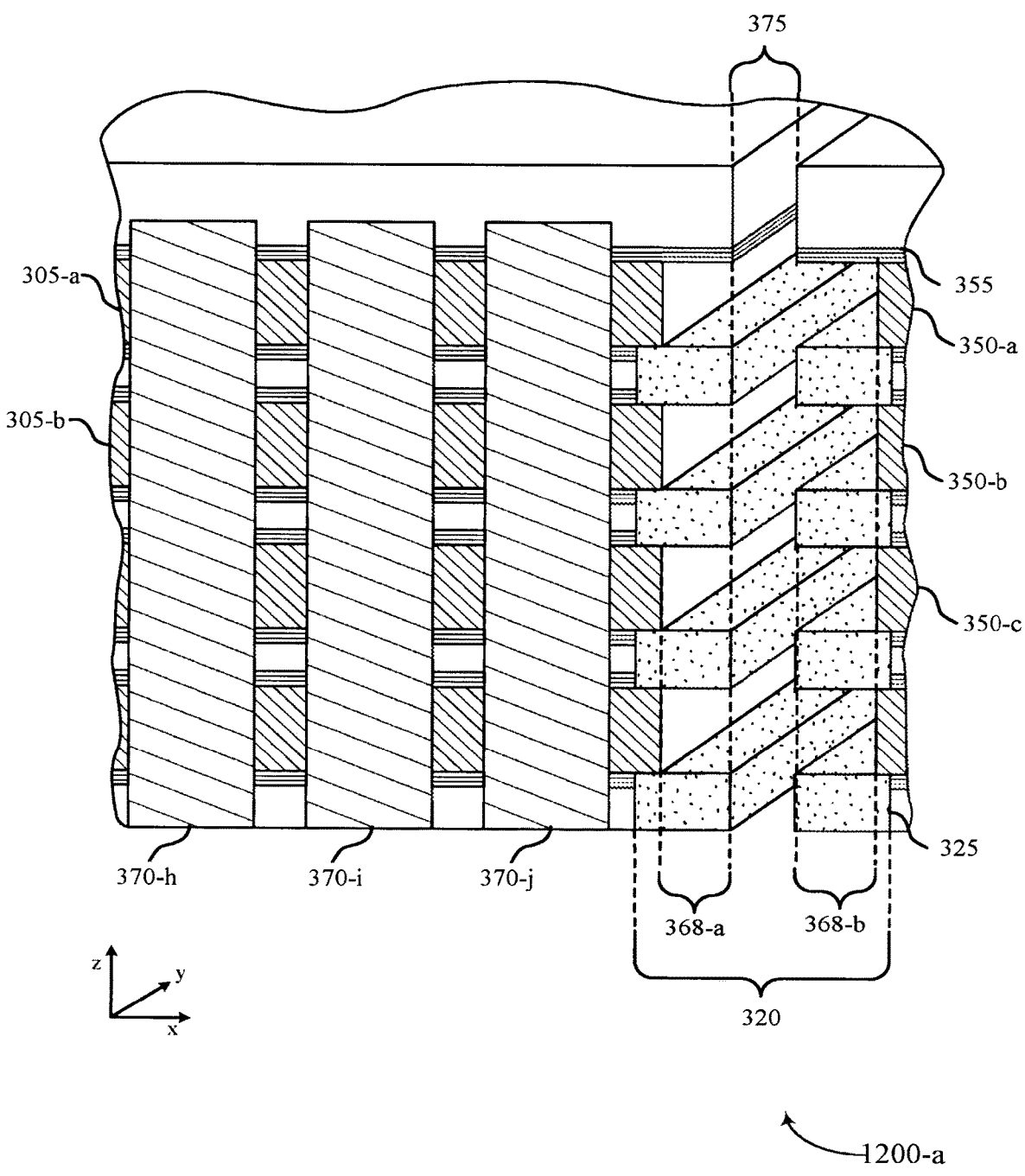

FIG. 12A illustrates an example of a memory device configuration 1200-a that supports single crystal silicon cores for stacked memory cells in accordance with examples as disclosed herein. The memory device configuration 1200-a may be an example of or implement aspects of the memory device 100 or memory architecture 200 as described with reference to FIGS. 1 and 2, respectively. Additionally, the memory device configuration 1200-a may be a continuation of the memory device configurations 1100-a and 1100-c as described with reference to FIGS. 11A and 11C.

The manufacturing system may form, along the length of the trench 375, a plurality of recesses 368 (e.g., recesses 368-a and 368-b) in each layer (e.g., level) of the silicon material 305. For example, each recess 368 may extend along the y-direction and may be located between (e.g., in contact with) the remaining silicon material 305, an upper layer of the material 325, a lower layer of the material 325, and the trench 375. For example, the plurality of recesses 368-a and 368-b may connect each layer of the silicon material 305 to the trench 375. As a result of the recesses 368, each layer of the material 325 may be wider (e.g., extend farther into the trench 375) than the layers of silicon material 305 along the x-direction. For example, each dielectric material 325, relative to the neighboring layers of silicon material 305, may form a lateral plateau along the x-direction. In some cases, each of the recesses 368 may be formed through a selective etch method or a wet etch method.

Figure 12B:
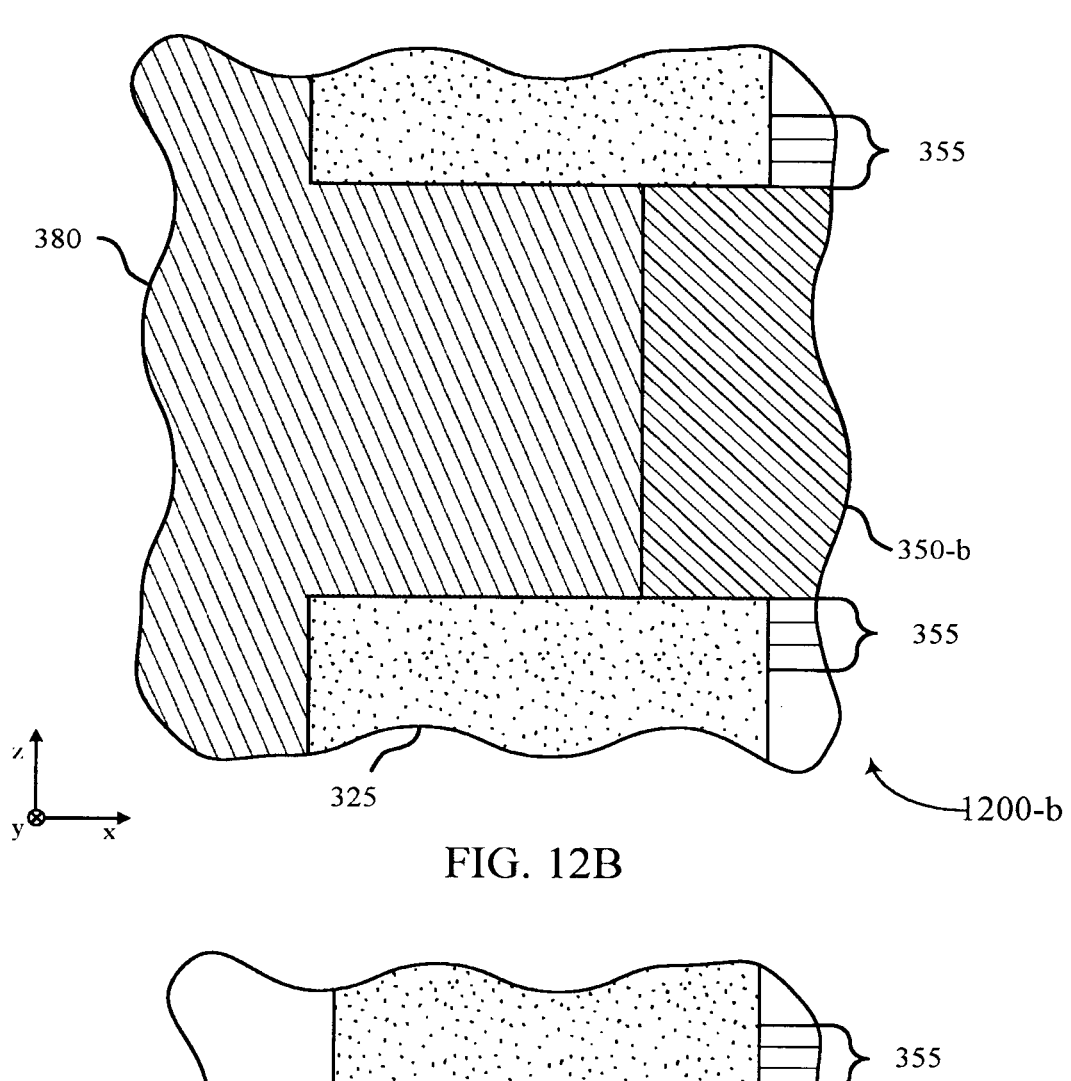

FIG. 12B illustrates an example of a memory device configuration 1200-b that supports single crystal silicon cores for stacked memory cells in accordance with examples as disclosed herein. The memory device configuration 1200-b may be an example of or implement aspects of the memory device 100 or memory architecture 200 as described with reference to FIGS. 1 and 2, respectively. Additionally, the memory device configuration 1200-b may be a continuation of the memory device configuration 1200-a as described with reference to FIG. 12A.

The manufacturing system may deposit, in the trench 375, a polysilicon material 380. Additionally, the polysilicon material 380 may be deposited in each of the recesses 368-a and 368-b on either side of the trench 375. The polysilicon material may represent or form a portion of a contact between a respective bit line and a drain contact of a respective silicon core 350. In some cases, the polysilicon material 380 may be a heavily-doped n-type polysilicon. In some examples, the manufacturing system may apply a gas phase doping process before the polysilicon material 380 is deposited.

Figure 12C:
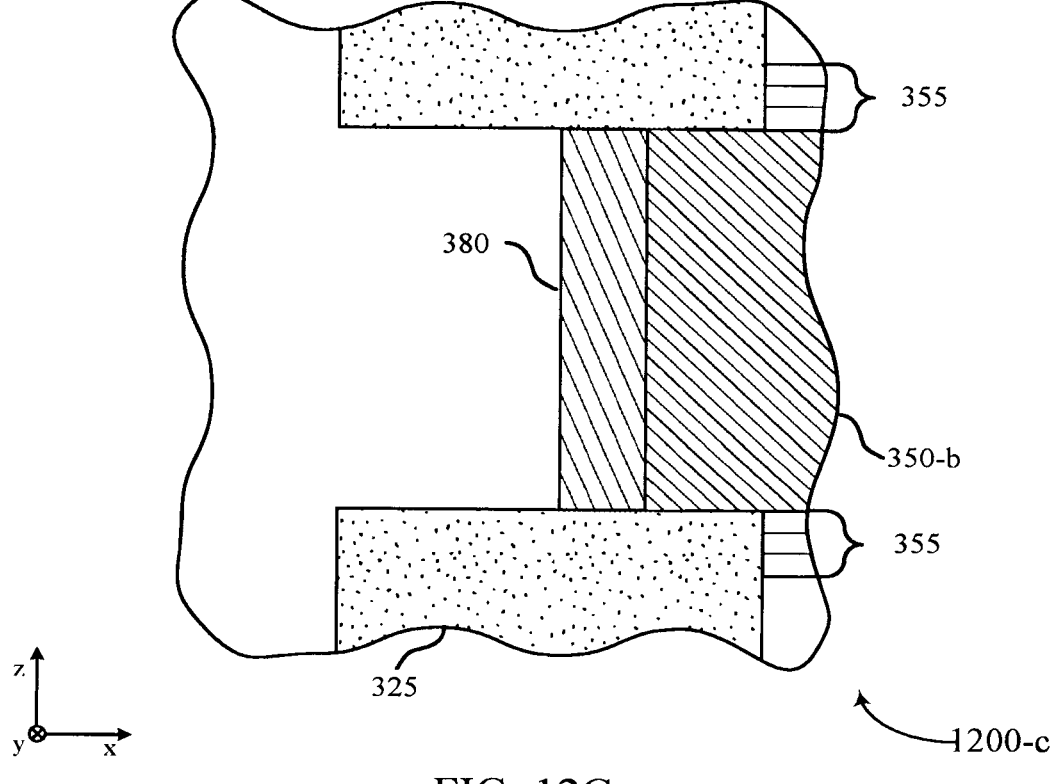

FIG. 12C illustrates an example of a memory device configuration 1200-c that supports single crystal silicon cores for stacked memory cells in accordance with examples as disclosed herein. The memory device configuration 1200-c may be an example of or implement aspects of the memory device 100 or memory architecture 200 as described with reference to FIGS. 1 and 2, respectively. Additionally, the memory device configuration 1200-c may be a continuation of the memory device configuration 1200-b as described with reference to FIG. 12B.

After depositing the polysilicon material 380, the manufacturing system may etch the material 380 back to a defined depth. For example, the manufacturing system may remove (e.g., selectively etch) the portion of the material 380 in the trench 375, and recess a portion of the material 380 in each recess 368. By removing the material 380 from the trench 375, and the portions of the material 380 from each recess 368, a layer of the material 380 may remain in each recess 368. For example, the layer of the material 380 may extend along a row of silicon cores 350 along the y-direction. In some examples, the material 380 may be coupled with the multiple silicon cores 350 of a respective row of silicon cores 350 (e.g., along the y-direction). In some cases, the manufacturing system may apply the gas phase doping process after etching the polysilicon material 380.

Figure 12D:
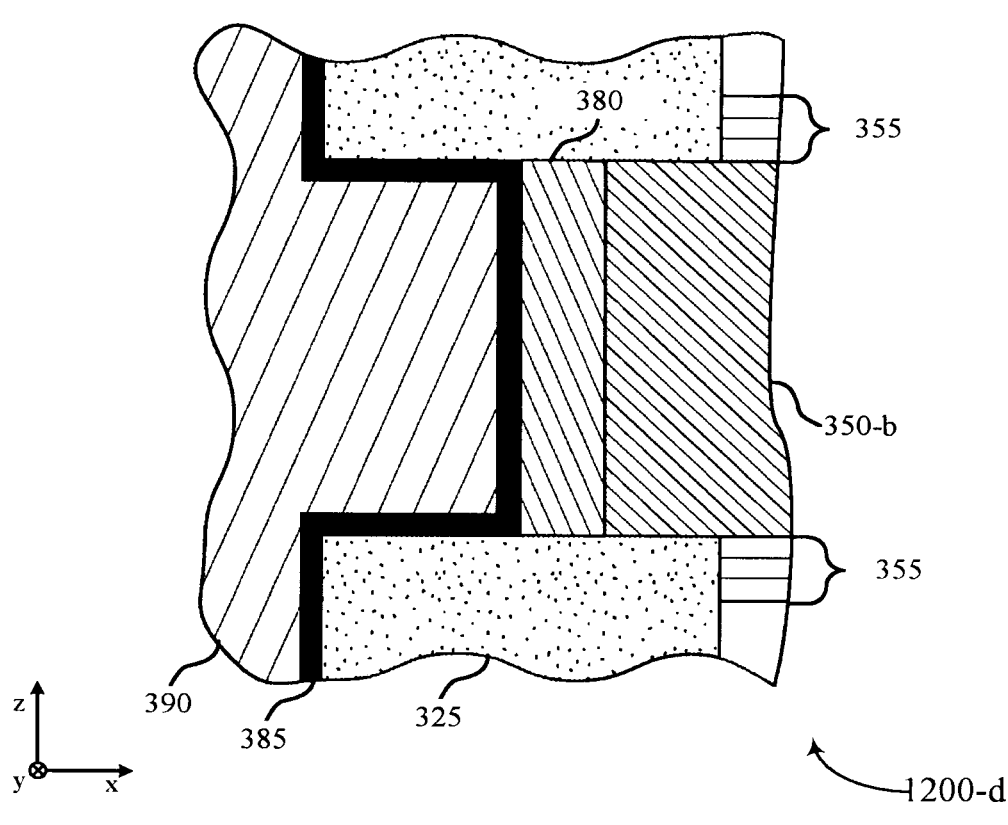

FIG. 12D illustrates an example of a memory device configuration 1200-d that supports single crystal silicon cores for stacked memory cells in accordance with examples as disclosed herein. The memory device configuration 1200-d may be an example of or implement aspects of the memory device 100 or memory architecture 200 as described with reference to FIGS. 1 and 2, respectively. Additionally, the memory device configuration 1200-d may be a continuation of the memory device configuration 1200-c as described with reference to FIG. 12C.

After recessing the material 380, the manufacturing system may form a layer of a contact material 385 along the inside of the trench 375 and the recesses 368 using a selective growth process. For example, the layer of contact material 385 may line the interior of the trench 375 (e.g., covering each plateau of the material 325, and each recess 368 with the material 380). In some examples, the contact material 385 may be a metal compound, such as a titanium or a titanium nitride. In some cases, the contact material 385 may form a respective contact material coupled with the material 380.

After forming the contact material 385, the manufacturing system may form, in the lined trench 375 and the lined recesses 368, a material 390 (e.g., a bit line material). For example, the material 390 may be an example of a conductive material such as tungsten. In some cases, the material 390 may be coupled with the respective contact material 385 (e.g., and be coupled with the respective material 380 via the contact material 385, and coupled with a respective silicon core 350 via the material 380 and the contact material 385).

Figure 12E:
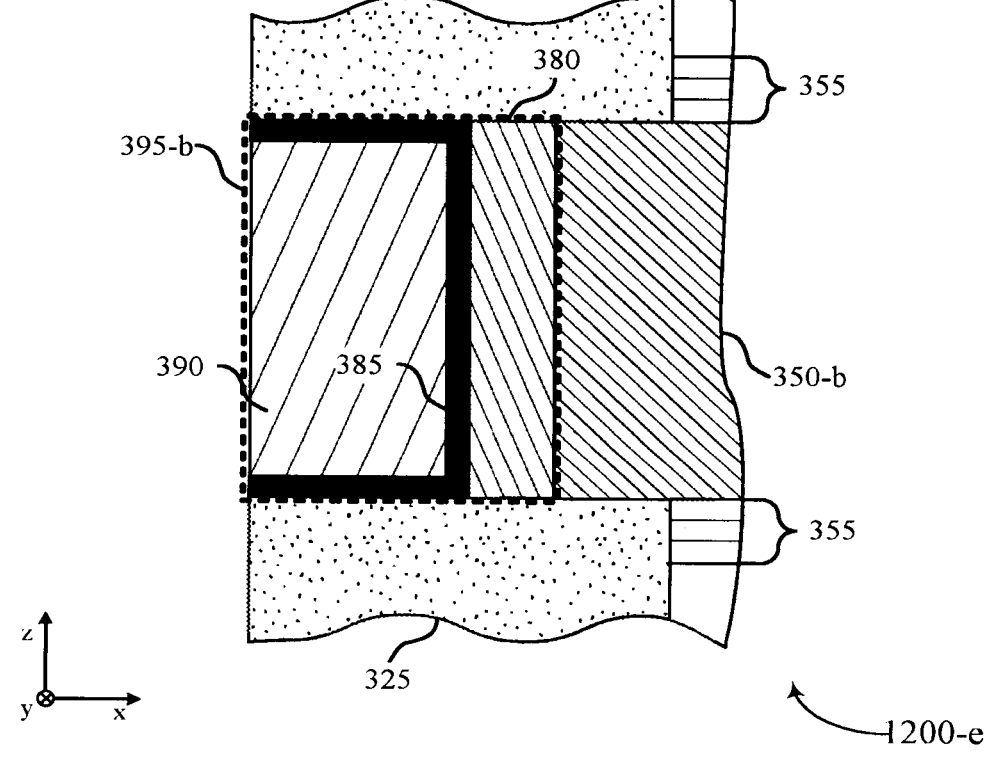

FIG. 12E illustrates an example of a memory device configuration 1200-e that supports single crystal silicon cores for stacked memory cells in accordance with examples as disclosed herein. The memory device configuration 1200-e may be an example of or implement aspects of the memory device 100 or memory architecture 200 as described with reference to FIGS. 1 and 2, respectively. Additionally, the memory device configuration 1200-e may be a continuation of the memory device configuration 1200-d as described with reference to FIG. 12D.

After forming the material 390, the manufacturing system may remove (e.g., etch) portions of the contact material 385 and the conductive material 390. For example, the contact material 385 and the conductive material 390 may be selectively etched (e.g., wet etched, vapor etched, dry etched) back to be removed from the center portion of the trench 375, but left within the recesses 368. In some cases, a small portion of the contact material 385 and the conductive material 390 may be removed from the recess 368 such that the contact material 385 and the conductive material 390 are recessed within the respective trenches.

In some cases, the formation of the polysilicon material 380, the contact material 385, and the conductive material 390 may form multiple conductive lines 395 (e.g., bit lines) extending along the y-direction. For example, each conductive line 395 may be located at each level of the silicon material 305 and may be coupled with the corresponding silicon material 305. Additionally, each conductive line 395 may be coupled with the silicon cores 350 (e.g., a row of the silicon cores 350) at the respective level of the silicon material 305 (e.g., coupled via the silicon material 305). For example, a conductive line 395-b may be formed at the level of the silicon material 305-b. Accordingly, the conductive line 395-b may also be formed at the level of the silicone core 350-b, as well as the silicon cores 350-e and 350-h. The conductive lines 395-d, 395-e, and 395-f may similarly be formed with respect to corresponding rows of silicon cores 350.

Figure 12F:
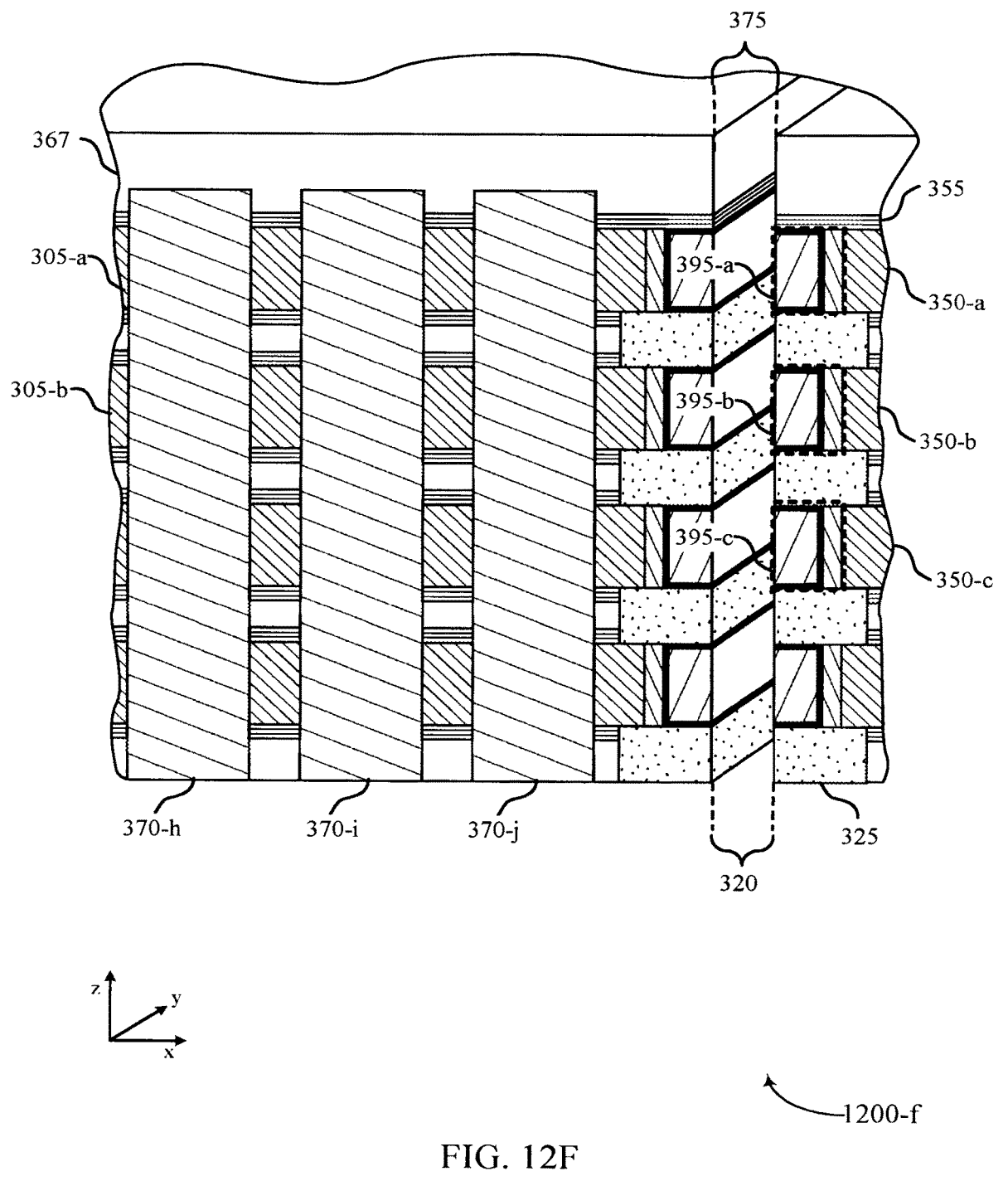

FIG. 12F illustrates an example of a memory device configuration 1200-f that supports single crystal silicon cores for stacked memory cells in accordance with examples as disclosed herein. The memory device configuration 1200-f may be an example of or implement aspects of the memory device 100 or memory architecture 200 as described with reference to FIGS. 1 and 2, respectively. Additionally, the memory device configuration 1200-f may be a continuation of the memory device configuration 1200-e as described with reference to FIG. 12E.

As described with reference to FIG. 12E, the formation of the polysilicon material 380, the contact material 385, and the conductive material 390 may form multiple conductive lines (e.g., bit lines) 395 extending along the y-direction. For example, each conductive line 395 may be located at each level of the silicon material 305. Additionally, each conductive line 395 may be coupled with the silicon cores 350 (e.g., a row of the silicon cores 350) at the respective level of the silicon material 305. For example, a conductive line 395-a may be formed at the level of the silicon material 305-a, and may be coupled with at least the silicon cores 350-a, 350-d, and 350-g. The conductive line 395-b may also be formed at the level of the silicone core 350-b, and may be coupled with at least the silicon cores 350-b, 350-e, 350-h. Additionally, a conductive line 395-c may be formed at the next lowest level of the silicon material 305, and may be coupled with at least the silicon cores 350-c, 350-f, and 350-i, and so on. In some cases, each of the conductive lines 395 may be activated to apply a voltage to each of the associated silicon cores 350 (e.g., for accessing associated memory cells).

Figures 13A, 13B:
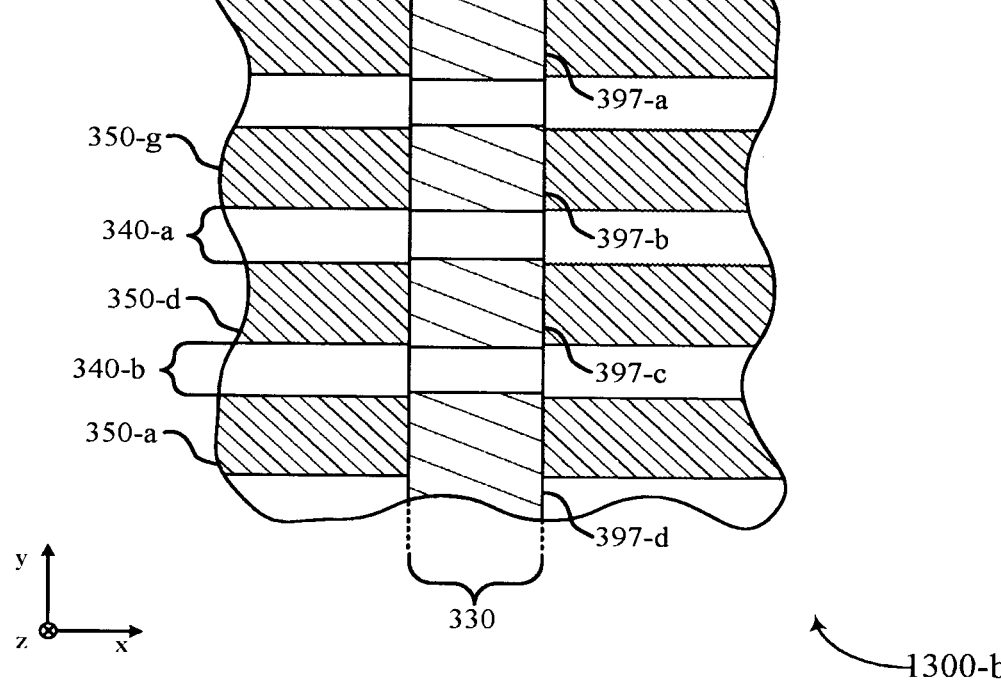

FIG. 13A illustrates an example of a memory device configuration 1300-a that supports single crystal silicon cores for stacked memory cells in accordance with examples as disclosed herein. The memory device configuration 1300-a may be an example of or implement aspects of the memory device 100 or memory architecture 200 as described with reference to FIGS. 1 and 2, respectively. Additionally, the memory device configuration 1300-a may be a continuation of the memory device configuration 1200-f as described with reference to FIG. 12F.

The memory device configuration 1300-a may represent a top view (e.g., along the z-direction) of the trench 330 and the associated material 335. The manufacturing system may remove (e.g., etch) a portion of the material 367 from at least above the trench 330. For example, the manufacturing system may etch through the material 367 along the y-direction above the trench 330, so that at least the top side of the material 335 is exposed.

FIG. 13B illustrates an example of a memory device configuration 1300-b that supports single crystal silicon cores for stacked memory cells in accordance with examples as disclosed herein. The memory device configuration 1300-b may be an example of or implement aspects of the memory device 100 or memory architecture 200 as described with reference to FIGS. 1 and 2, respectively. Additionally, the memory device configuration 1300-b may be a continuation of the memory device configuration 1300-a as described with reference to FIG. 13A.

The manufacturing system may remove (e.g., etch) one or more portions of the material 335 from inside the trench 330. For example, in some cases, the manufacturing system may apply a dry etch method to the material 335 in the trench 330, and remove the portions of the material 335 from between each column of silicon cores 350 (e.g., columns along the z-direction). For example, each of the removed portions of the material 335, may align or overlap with the trenches 340. In this example, each silicon core 350 of a respective column of silicon cores 350 may be coupled with the material 335 (e.g., silicon material), while each column of silicon cores 350 may be separated along the y-direction. In some cases, the manufacturing system may remove the portions of the material 335 after forming the conductive lines 395. In some other cases, the manufacturing system may remove the portions of the material 335 before forming the conductive lines 395.

Each remaining portion of the material 335 (e.g., silicon material) may form a source contact for each column 365 of the silicon cores 350. For example, the column 365-b, which may include the silicon cores 350-d, 350-e, and 350-f, may be associated with the source contact 397-c. Accordingly, each column 365 of the silicon cores 350 may be selected based on the respective source contact being activated (e.g., along with a respective drain contact being activated for the respective silicon core 350).

In some cases, if the material 335 is an oxide, the manufacturing system may remove the material 335 from the trench 330. In this case, the material 335 may be replaced with a new material to form the source contacts in the pattern shown by FIG. 13B.

Figure 14:
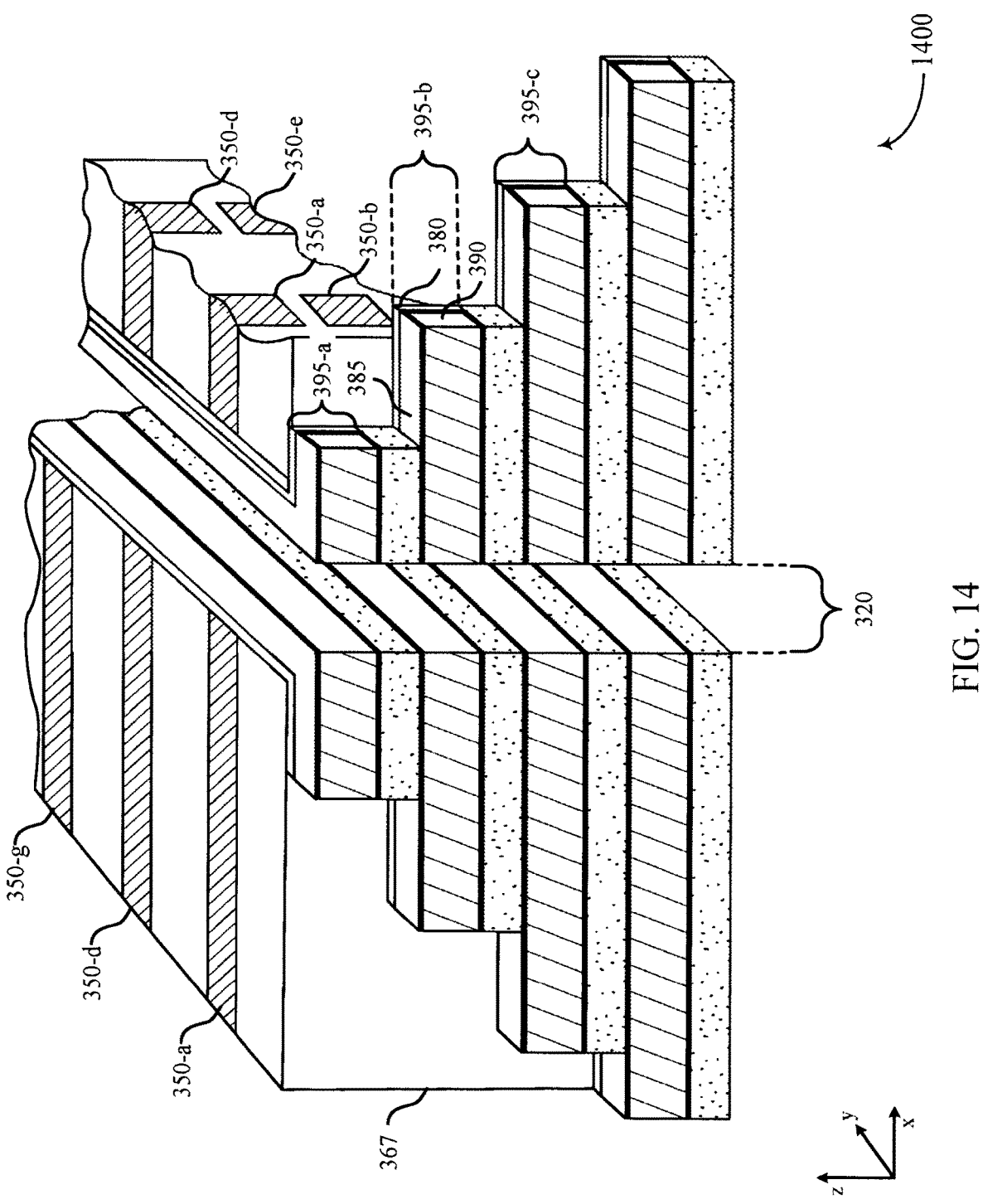

FIG. 14 illustrates an example of a memory device configuration 1400 that supports single crystal silicon cores for stacked memory cells in accordance with examples as disclosed herein. The memory device configuration 1400 may be an example of or implement aspects of the memory device 100 or memory architecture 200 as described with reference to FIGS. 1 and 2, respectively. Additionally, the memory device configuration 1400 may be a continuation of the memory device configuration 1300-b as described with reference to FIG. 13B.

During the formation of the conductive lines 395, the conductive lines 395 may be formed both in trenches that extend along the y-direction, as well as in intersecting trenches that extend along the x-direction. For example, each of the materials 380, 385, and 390 may extend past the silicon channels (e.g., in the y-direction), and along at least one side of the perimeter of the material 367 (e.g., in the x-direction).

After formation of the conductive lines 395 (e.g., in the y-direction and the x-direction), the manufacturing system may apply an etching method (e.g., a dry etch method or a wet etch method) to the end of each respective conductive line 395. In some examples, the manufacturing system may etch each respective conductive line to a different depth along the x-direction, creating a step (e.g., staircase) formation. For example, the conductive line 395-b may extend past the conductive line 395-a, the conductive line 395-c may extend past the conductive line 395-c, and so on. The stepped nature of the conductive lines 395 (e.g., the staircase) may support access contacts for applying voltages to different respective conductive lines 395, which may further support accessing a respective level of silicon cores 350 via a respective conductive line 395 (e.g., by applying a voltage thereto).

In order to support access each conductive line, the manufacturing system may form, for each of the conductive lines 395, a respective contact (e.g., for applying a voltage to the respective conductive line 395). For example, each of the conductive lines 395 may be coupled with a contact at each level of the staircase formation and may be coupled with a decoder via the respective contact. The respective contacts (e.g., together with the decoder) may be used to activate (e.g., apply a voltage to) each conductive line 395 of the staircase formation.

Figure 15:
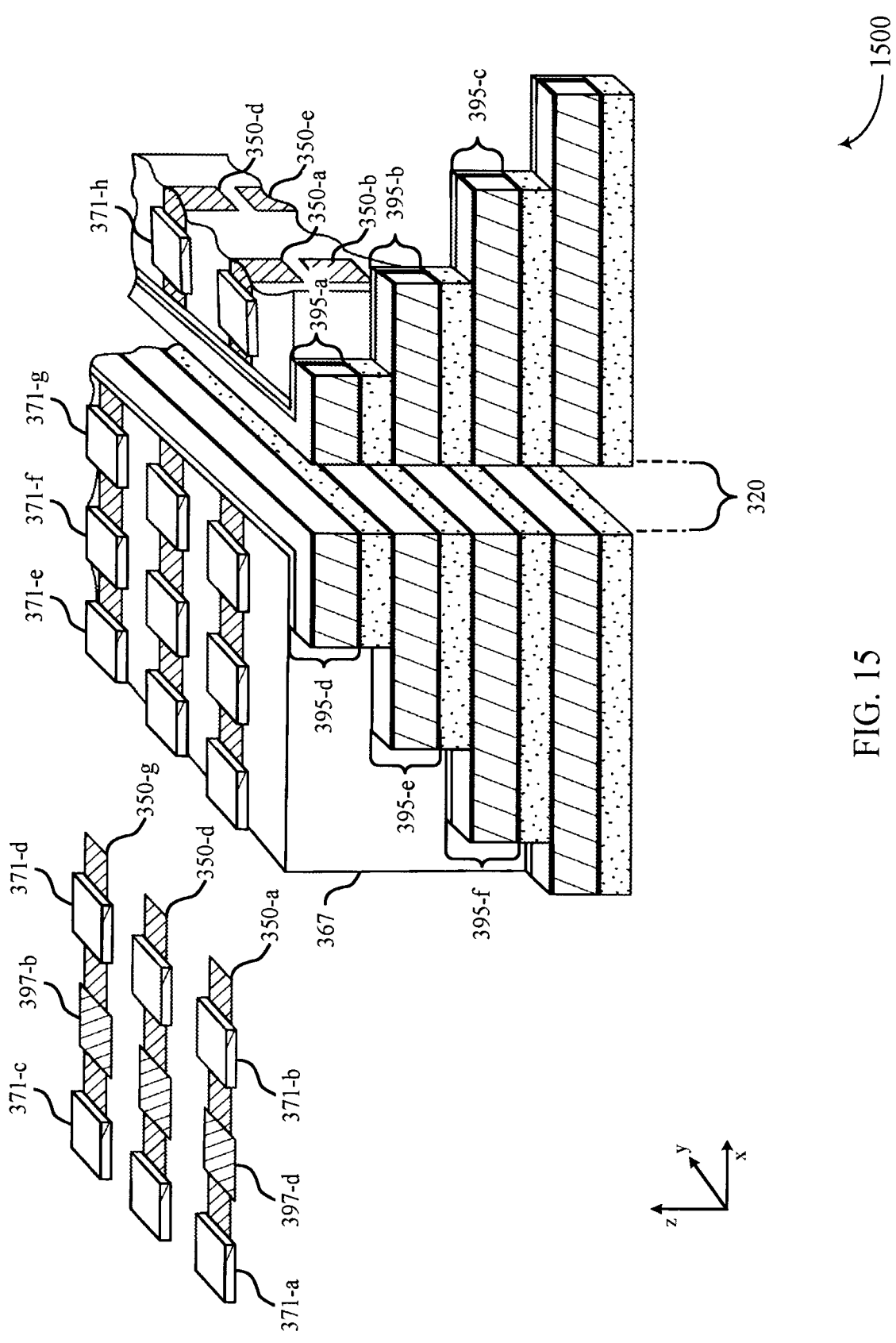

FIG. 15 illustrates an example of a memory device configuration 1500 that supports single crystal silicon cores for stacked memory cells in accordance with examples as disclosed herein. The memory device configuration 1500 may be an example of or implement aspects of the memory device 100 or memory architecture 200 as described with reference to FIGS. 1 and 2, respectively. Additionally, the memory device configuration 1500 may be a continuation of the memory device configuration 1400 as described with reference to FIG. 14.

After forming the structures described herein, the manufacturing system may apply a selective etching method (e.g., wet etching or dry etching) to the top (e.g., along the z-direction) of the material 367. For example, selectively etching the material 367 may remove the material 367 from the top of the memory device configuration, exposing a top end of each of the conductive lines 370 and each source contact 397. Exposing the conductive lines 370 and the source contacts 397 may support coupling each conductive line 370 and each source contact 397 with a respective voltage source or a respective decoder (e.g., or other component) operable to activate (e.g., apply a voltage to) the respective conductive line 370 or source contact 397. In this example, the exposed conductive lines may be examples of contacts 371. For example, contacts 371-a, 371-b, 371-c, and 371-d (e.g., the contacts neighboring the source contacts 397) may be examples of source gate metal contacts, contacts 371-e and 371-f may be examples of array gate metal contacts, and contacts 371-g and 371-h (e.g., the contacts neighboring the trench 320) may be examples of drain gate metal contacts.

Each memory cell of the multiple memory cells may be operable to be activated based at least in part on a first voltage applied to the respective conductive line 370 (e.g., and the respective contact 371) associated with the memory cell and a second voltage applied to the respective conductive line 395 associated with the memory cell (e.g., and a voltage applied to a respective source contact 397 associated with the memory cell). In some cases, each conductive line 370 may be operable to apply a voltage to a respective gate electrode associated with a set of memory materials 355 associated with the respective conductive line 370. In some cases, additional metal interconnect contacts may extend to each respective conductive line 395. For example, the manufacturing system may use a dry etch process to form one or more contact holes through the dielectric materials 367 and connect with a respective contact of a staircase formation. The staircase structure may configure an area of each layer that is capable of contacting a metal interconnect contact. In some cases, the manufacturing system may use CVD to form one or more vias (e.g., CVD W) and via barriers (e.g., CVD Ti or CVD TiN).

FIG. 16 shows a flowchart shows a flowchart illustrating a method or methods 1600 that supports single crystal silicon cores for stacked memory cells in accordance with examples as disclosed herein. The operations of method 1600 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 1605, the method may include forming a stack of materials over a substrate, the stack of materials including a plurality of silicon materials and a plurality of second materials, where silicon materials of the plurality of silicon materials alternate with second materials of the plurality of second materials within the stack. The operations of 1605 may be performed in accordance with examples as disclosed herein.

At 1610, the method may include forming, from the plurality of silicon materials, a plurality of silicon cores each extending along a first direction and each associated with a respective plurality of memory cells. The operations of 1610 may be performed in accordance with examples as disclosed herein.

At 1615, the method may include forming memory materials surrounding each silicon core of the plurality of silicon cores in a second direction, the memory materials including a gate material associated with the respective plurality of memory cells. The operations of 1615 may be performed in accordance with examples as disclosed herein.

At 1620, the method may include forming a respective conductive material around the memory materials of each silicon core of the plurality of silicon cores, where the respective conductive materials of a respective subset of silicon cores of the plurality of silicon cores form a respective block of conductive material. The operations of 1620 may be performed in accordance with examples as disclosed herein.

In some examples, an apparatus (e.g., a manufacturing system) as described herein may perform a method or methods, such as the method 1600. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming a stack of materials over a substrate, the stack of materials including a plurality of silicon materials and a plurality of second materials, where silicon materials of the plurality of silicon materials alternate with second materials of the plurality of second materials within the stack; forming, from the plurality of silicon materials, a plurality of silicon cores each extending along a first direction and each associated with a respective plurality of memory cells; forming memory materials surrounding each silicon core of the plurality of silicon cores in a second direction, the memory materials including a gate material associated with the respective plurality of memory cells; and forming a respective conductive material around the memory materials of each silicon core of the plurality of silicon cores, where the respective conductive materials of a respective subset of silicon cores of the plurality of silicon cores form a respective block of conductive material.

Aspect 2: The method or apparatus of aspect 1, further including operations, features, circuitry, logic, means, or instructions, or any combination thereof for forming a plurality of first trenches through the stack of materials, each of the plurality of first trenches extending along the first direction and removing the plurality of second materials to form a plurality of second trenches each extending along the first direction.

Aspect 3: The method or apparatus of any of aspects 1 through 2, further including operations, features, circuitry, logic, means, or instructions, or any combination thereof for removing a plurality of first sections from each respective block of conductive material to form a respective plurality of first conductive lines, where each first conductive line of the respective pluralities of first conductive lines is associated with a respective memory cell of the respective plurality of memory cells and forming a dielectric material between the plurality of silicon cores, the respective pluralities of first conductive lines, and combinations thereof.

Aspect 4: The method or apparatus of aspect 3, further including operations, features, circuitry, logic, means, or instructions, or any combination thereof for forming a plurality of holes that each extend through the dielectric material, where forming each of the plurality of holes includes removing, on a first two respective sides of a respective subset of the plurality of silicon cores, a respective portion of the dielectric material, a respective first portion of the respective block of conductive material, and a respective first portion of the memory materials and removing, on a second two respective sides of the respective subset of the plurality of silicon cores, a respective second portion of the respective block of conductive material and a respective second portion of the memory materials, where each respective removed second portion is connected with the respective removed first portion.

Aspect 5: The method or apparatus of aspect 4, further including operations, features, circuitry, logic, means, or instructions, or any combination thereof for filling the plurality of holes with the dielectric material after removing the plurality of first sections.

Aspect 6: The method or apparatus of any of aspects 1 through 5, further including operations, features, circuitry, logic, means, or instructions, or any combination thereof for forming a third trench through the stack of layers, the third trench extending along a third direction; filling the third trench with a polysilicon material; forming a fourth trench through the stack of layers, the fourth trench extending along the third direction; and filling the fourth trench with a third material.

Aspect 7: The method or apparatus of aspect 6, where each of the plurality of silicon cores extends along the first direction between the third trench and the fourth trench.

Aspect 8: The method or apparatus of any of aspects 6 through 7, further including operations, features, circuitry, logic, means, or instructions, or any combination thereof for removing a portion of the third material from the fourth trench and forming, within the fourth trench and based at least in part on removing the portion of the third material, a plurality of second conductive lines each extending along the third direction at a respective level of silicon material, where each second conductive line of the plurality of second conductive lines is coupled with multiple silicon cores at the respective level of silicon material.

Aspect 9: The method or apparatus of aspect 8, further including operations, features, circuitry, logic, means, or instructions, or any combination thereof for forming, via the fourth trench, a respective recess at each level of silicon material, the respective recesses connected with the fourth trench and forming, in each of the respective recesses, a respective polysilicon material coupled with the multiple silicon cores, a respective contact material coupled with the respective polysilicon material, and a respective second conductive material coupled with the respective contact material.

Aspect 10: The method or apparatus of any of aspects 8 through 9, further including operations, features, circuitry, logic, means, or instructions, or any combination thereof for forming, for each second conductive line, a respective contact coupled with the second conductive line and operable to apply a respective voltage to the second conductive line.

Aspect 11: The method or apparatus of any of aspects 6 through 10, further including operations, features, circuitry, logic, means, or instructions, or any combination thereof for removing a plurality of second sections from the polysilicon material in the third trench to form a plurality of polysilicon materials, each polysilicon material of the plurality coupled with a respective subset of silicon cores of the plurality of silicon cores.

Aspect 12: The method or apparatus of any of aspects 6 through 11, wherein a first polysilicon material of the plurality and a second polysilicon material of the plurality are highly-doped n-type polysilicon, the first polysilicon material associated with a drain contact and the second polysilicon material associated with a source contact.

Aspect 13: The method or apparatus of any of aspects 1 through 11, where each of the plurality of silicon cores includes a respective single crystal of silicon and the plurality of silicon cores includes a plurality of subsets of silicon cores, each subset of the plurality of subsets including two or more respectively aligned silicon cores each located at a different level of the stack of materials.

Aspect 14: The method or apparatus of aspect 1 through 11, wherein one of the second materials comprise a silicon germanium alloy associated with a constant atomic ratio of silicon germanium or a variable atomic ratio of silicon germanium.

FIG. 17 shows a flowchart shows a flowchart illustrating a method or methods 1700 that supports single crystal silicon cores for stacked memory cells in accordance with examples as disclosed herein. The operations of method 1700 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 1705, the method may include forming a stack of materials over a substrate, the stack of materials including a plurality of silicon materials and a plurality of second materials, where silicon materials of the plurality of silicon materials alternate with second materials of the plurality of second materials within the stack. The operations of 1705 may be performed in accordance with examples as disclosed herein.

At 1710, the method may include forming, from the plurality of silicon materials, a plurality of silicon cores each extending along a first direction and each associated with a respective plurality of memory cells. The operations of 1710 may be performed in accordance with examples as disclosed herein.

At 1715, the method may include forming memory materials surrounding each silicon core of the plurality of silicon cores in a second direction, the memory materials including a gate material associated with the respective plurality of memory cells. The operations of 1715 may be performed in accordance with examples as disclosed herein.

At 1720, the method may include forming a respective conductive material around the memory materials of each silicon core of the plurality of silicon cores, where the respective conductive materials of a respective subset of silicon cores of the plurality of silicon cores form a respective block of conductive material. The operations of 1720 may be performed in accordance with examples as disclosed herein.

At 1725, the method may include removing a plurality of first sections from each respective block of conductive material to form a respective plurality of first conductive lines, where each first conductive line of the respective pluralities of first conductive lines is associated with a respective memory cell of the respective plurality of memory cells. The operations of 1725 may be performed in accordance with examples as disclosed herein.

At 1730, the method may include forming a dielectric material between the plurality of silicon cores, the respective pluralities of first conductive lines, and combinations thereof. The operations of 1730 may be performed in accordance with examples as disclosed herein.

At 1735, the method may include forming a plurality of holes that each extend through the dielectric material, where forming each of the plurality of holes includes removing, on a first two respective sides of a respective subset of the plurality of silicon cores, a respective portion of the dielectric material, a respective first portion of the respective block of conductive material, and a respective first portion of the memory materials. The operations of 1735 may be performed in accordance with examples as disclosed herein.

At 1740, the method may include removing, on a second two respective sides of the respective subset of the plurality of silicon cores, a respective second portion of the respective block of conductive material and a respective second portion of the memory materials, where each respective removed second portion is connected with the respective removed first portion. The operations of 1740 may be performed in accordance with examples as disclosed herein.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 15: An apparatus, including: a plurality of silicon cores that each extend along a first direction and are each associated with a respective plurality of memory cells, where the plurality of silicon cores includes respective subsets of aligned silicon cores each located at a different level along a third direction; a plurality of memory materials that each surround a respective portion of a corresponding silicon core of the plurality of silicon cores in a second direction, where the plurality of memory materials includes respective subsets of aligned memory materials each located at a different level along the third direction; and a respective conductive material associated with each respective subset of memory materials, the respective conductive material surrounding the respective subset of memory materials in the second direction.

Aspect 16: The apparatus of aspect 15, where the respective conductive material is operable to apply a voltage to a respective gate electrode associated with each memory material of a second subset of memory materials corresponding to the respective conductive material.

Aspect 17: The apparatus of any of aspects 15 through 16, further including: a respective polysilicon contact coupled with each first subset of silicon cores, the respective polysilicon contacts extending along the second direction; and a respective conductive line extending along a fourth direction and coupled with multiple silicon cores of the plurality of silicon cores at a same level.

Aspect 18: The apparatus of any of aspects 15 through 17, wherein the respective polysilicon contact comprises a highly-doped n-type polysilicon associated with a source contact.

Aspect 19: The apparatus of aspect 17, where a memory cell of the respective plurality of memory cells is operable to be activated based at least in part on a first voltage applied to the respective conductive material associated with the memory cell and a second voltage applied to the respective conductive line associated with the memory cell.

Aspect 20: The apparatus of any of aspects 17 through 19, where each of the respective conductive lines includes: a respective polysilicon material coupled with the multiple silicon cores; a respective contact material coupled with the respective polysilicon material; and a respective second conductive material coupled with the respective contact material.

Aspect 21: The apparatus of any of aspects 17 through 20, further including: a respective contact coupled with each conductive line of the respective conductive lines, the respective contacts each operable to apply a respective voltage to the corresponding conductive line.

Aspect 22: The apparatus of any of aspects 15 through 21, where each of the memory materials includes a respective gate material associated with a respective memory cell.

An apparatus is described. The following provides an overview of aspects of the apparatus as described herein:

Aspect 23: An apparatus formed by a process including: forming a stack of materials over a substrate, the stack of materials including a plurality of silicon materials and a plurality of second materials, where silicon materials of the plurality of silicon materials alternate with second materials of the plurality of second materials within the stack; forming, from the plurality of silicon materials, a plurality of silicon cores each extending along a first direction and each associated with a respective plurality of memory cells; forming memory materials surrounding each silicon core of the plurality of silicon cores in a second direction, the memory materials including a gate material associated with the respective plurality of memory cells; and forming a respective conductive material around the memory materials of each silicon core of the plurality of silicon cores, where the respective conductive materials of a respective subset of silicon cores of the plurality of silicon cores form a respective block of conductive material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a plurality of silicon cores that each extend along a first direction and are each associated with a respective plurality of memory cells, wherein the plurality of silicon cores comprises respective subsets of aligned silicon cores each located at a different level along a third direction;
a plurality of memory materials that each surround a respective portion of a corresponding silicon core of the plurality of silicon cores in a second direction, wherein the plurality of memory materials comprises respective subsets of aligned memory materials each located at a different level along the third direction; and
a respective conductive material associated with each respective subset of memory materials, the respective conductive material surrounding the respective subset of memory materials in the second direction.

2. The apparatus of claim 1, wherein the respective conductive material is operable to apply a voltage to a respective gate electrode associated with each memory material of a second subset of memory materials corresponding to the respective conductive material.

3. The apparatus of claim 1, further comprising:
a respective polysilicon contact coupled with each first subset of silicon cores, the respective polysilicon contacts extending along the second direction; and
a respective conductive line extending along a fourth direction and coupled with multiple silicon cores of the plurality of silicon cores at a same level.

4. The apparatus of claim 3, wherein the respective polysilicon contact comprises a highly-doped n-type polysilicon associated with a source contact.

5. The apparatus of claim 3, wherein a memory cell of the respective plurality of memory cells is operable to be activated based at least in part on a first voltage applied to the respective conductive material associated with the memory cell and a second voltage applied to the respective conductive line associated with the memory cell.

6. The apparatus of claim 3, wherein each of the respective conductive lines comprises:
a respective polysilicon material coupled with the multiple silicon cores;
a respective contact material coupled with the respective polysilicon material; and
a respective second conductive material coupled with the respective contact material.

7. The apparatus of claim 3, further comprising:
a respective contact coupled with each conductive line of the respective conductive lines, the respective contacts each operable to apply a respective voltage to the respective conductive line.

8. The apparatus of claim 1, wherein each of the memory materials comprises a respective gate material associated with a respective memory cell.

*    *    *    *    *